(12) United States Patent
Murakami et al.

(10) Patent No.: US 10,237,015 B2
(45) Date of Patent: Mar. 19, 2019

(54) TRANSMISSION METHOD, RECEPTION METHOD, TRANSMISSION DEVICE AND RECEPTION DEVICE

(71) Applicant: Panasonic Intellectual Property Management Co., Ltd., Osaka (JP)

(72) Inventors: Yutaka Murakami, Kanagawa (JP); Tomohiro Kimura, Osaka (JP); Mikihiro Ouchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 5 days.

(21) Appl. No.: 15/284,601

(22) Filed: Oct. 4, 2016

(65) Prior Publication Data
US 2017/0048020 A1    Feb. 16, 2017

Related U.S. Application Data

(63) Continuation of application No. PCT/JP2015/002341, filed on May 8, 2015.

(Continued)

(30) Foreign Application Priority Data

Apr. 17, 2015   (JP) .................................. 2015-084884

(51) Int. Cl.
    *H04L 1/00* (2006.01)
    *H03M 13/11* (2006.01)
    *H03M 13/00* (2006.01)

(52) U.S. Cl.
    CPC ....... *H04L 1/0041* (2013.01); *H03M 13/1102* (2013.01); *H03M 13/6362* (2013.01);
    (Continued)

(58) Field of Classification Search
    CPC ... H04L 1/0041; H04L 1/0057; H04L 1/0068; H03M 13/6362; H03M 13/6516; H03M 13/1102
    See application file for complete search history.

(56) References Cited

U.S. PATENT DOCUMENTS

| 8,356,137 B2* | 1/2013 | Post ...................... G06F 3/0644 711/103 |
| 8,495,477 B2* | 7/2013 | Song ..................... H04L 1/0057 714/758 |

(Continued)

FOREIGN PATENT DOCUMENTS

EP    3 089 369    11/2016

OTHER PUBLICATIONS

International Search Report of PCT application No. PCT/JP2015/002341 dated Jul. 21, 2015.

(Continued)

*Primary Examiner* — Cynthia Britt
(74) *Attorney, Agent, or Firm* — Wenderoth, Lind & Ponack, L.L.P.

(57) ABSTRACT

One coding method is selected from a plurality of coding methods per data symbol group, an information sequence is encoded by using the selected coding method. The plurality of coding methods includes at least a first coding method and a second coding method. The first coding method is a coding method with a first coding rate for generating a first codeword as a first encoded sequence by using a first parity check matrix. The second coding method is a coding method with a second coding rate different from the first coding rate and obtained after puncturing processing, where a second encoded sequence is generated by performing the puncturing processing on a second codeword by using a second parity check matrix different from the first parity check matrix. A number of bits of the first encoded sequence is equal to a number of bits of the second encoded sequence.

4 Claims, 17 Drawing Sheets

Related U.S. Application Data

(60) Provisional application No. 61/994,588, filed on May 16, 2014.

(52) U.S. Cl.
CPC ...... *H03M 13/6516* (2013.01); *H04L 1/0057* (2013.01); *H04L 1/0068* (2013.01)

(56) References Cited

U.S. PATENT DOCUMENTS

| | | | | |
|---|---|---|---|---|
| 2002/0157058 A1* | 10/2002 | Ariel | ...................... | H03M 13/27 714/774 |
| 2005/0249240 A1* | 11/2005 | Boyce | ...................... | G10L 19/24 370/469 |
| 2010/0199153 A1* | 8/2010 | Okamura | ............. | H03M 13/118 714/781 |
| 2010/0211854 A1* | 8/2010 | Wu | ......................... | H04L 1/007 714/776 |
| 2010/0325511 A1 | 12/2010 | Oh et al. | | |
| 2014/0233482 A1* | 8/2014 | Kimura | ................. | H04L 1/0068 370/329 |
| 2017/0041025 A1* | 2/2017 | Murakami | ......... | H03M 13/1102 |

OTHER PUBLICATIONS

DVB Document A122, "Frame structure channel coding and modulation for a second generation digital terrestrial television broadcasting system (DVB-T2)", Jun. 2008.

Qiuju Diao, et al., "LDPC codes on partial geometries: Construction, trapping set structure, and puncturing", IEEE Transactions on Information Theory, vol. 59, No. 12, pp. 7898-7914, Dec. 2013.

Extended European Search Report dated Apr. 19, 2017 in corresponding European Patent Application No. 15792823.5.

Vladimir Oksman et al: "G.hn: The New ITU-T Home Networking Standard", IEEE Communications Magazine, Oct. 1, 2009 (Oct. 1, 2009), pp. 138-145, XP055124491, DOI: 10.1109/MCOM.2009.5273821 p. 142.

M. Baldi et al: "Variable Rate LDPC Codes for Wireless Applications", Software in Telecommunications and Computer Networks, 2006. Softcom 20 06. International Conference on, IEEE, PI, Sep. 29, 2006 (Sep. 29, 2006), pp. 1-5, XP002579565, ISBN: 978-953-6114-90-0 p. 4.

ITU-T G.9960 Telecommunication Standardization Sector of ITU: "Unified High-Speed Wireline-Based Home Networking Transceivers—System Architecture and Physical Layer Specification", Dec. 31, 2011 (Dec. 31, 2011), pp. 1-160, XP055211279, Retrieved from the Internet: URL:https://www.itu.int/rec/T-REC-G.9960-2 01112-S/en [retrieved on Sep. 4, 2015] p. 73.

* cited by examiner

FIG. 5

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z = 8100 BITS | METHOD #A | METHOD #A | METHOD #A | METHOD #A | METHOD #A | METHOD #A | METHOD #A | METHOD #A | METHOD #A |
| z = 16200 BITS | METHOD #A | METHOD #A | METHOD #A | METHOD #A | METHOD #A | METHOD #A | METHOD #A | METHOD #A | METHOD #A |
| z = 64800 BITS | METHOD #B | METHOD #B | METHOD #B | METHOD #B | METHOD #B | METHOD #B | METHOD #B | METHOD #B | METHOD #B |

FIG. 6

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z = 8100 BITS | METHOD #A | METHOD #A | METHOD #A | METHOD #A | METHOD #A | METHOD #A | METHOD #A | METHOD #A | METHOD #A |
| z = 16200 BITS | METHOD #B | METHOD #B | METHOD #B | METHOD #B | METHOD #B | METHOD #B | METHOD #B | METHOD #B | METHOD #B |
| z = 64800 BITS | METHOD #B | METHOD #B | METHOD #B | METHOD #B | METHOD #B | METHOD #B | METHOD #B | METHOD #B | METHOD #B |

FIG. 7

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| $z$ IS 1000 BITS OR MORE AND 9000 BITS OR LESS | METHOD #A | METHOD #A | METHOD #A | METHOD #A | METHOD #A | METHOD #A | METHOD #A | METHOD #A | METHOD #A |
| $z$ IS 10000 BITS OR MORE AND 20000 BITS OR LESS | METHOD #A | METHOD #A | METHOD #A | METHOD #A | METHOD #A | METHOD #A | METHOD #A | METHOD #A | METHOD #A |
| $z$ IS 50000 BITS OR MORE AND 70000 BITS OR LESS | METHOD #B | METHOD #B | METHOD #B | METHOD #B | METHOD #B | METHOD #B | METHOD #B | METHOD #B | METHOD #B |

*FIG. 8*

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z IS 1000 BITS OR MORE AND 9000 BITS OR LESS | METHOD #A | METHOD #A | METHOD #A | METHOD #A | METHOD #A | METHOD #A | METHOD #A | METHOD #A | METHOD #A |
| z IS 10000 BITS OR MORE AND 20000 BITS OR LESS | METHOD #B | METHOD #B | METHOD #B | METHOD #B | METHOD #B | METHOD #B | METHOD #B | METHOD #B | METHOD #B |
| z IS 50000 BITS OR MORE AND 70000 BITS OR LESS | METHOD #B | METHOD #B | METHOD #B | METHOD #B | METHOD #B | METHOD #B | METHOD #B | METHOD #B | METHOD #B |

FIG. 9

| | |
|---|---|
| z IS LESS THAN 20000 BITS | METHOD #A |
| z IS 20000 BITS OR MORE | METHOD #B |

FIG. 10

| | |
|---|---|
| z IS LESS THAN 10000 BITS | METHOD #A |
| z IS 10000 BITS OR MORE | METHOD #B |

FIG. 12

| CODING RATE OF LESS THAN f | METHOD #B |
|---|---|
| CODING RATE OF e OR MORE AND f OR LESS | METHOD #A |
| CODING RATE OF LARGER THAN f | METHOD #B |

FIG. 13

| CODING RATE OF LESS THAN g | METHOD #B |
|---|---|
| CODING RATE OF g OR MORE | METHOD #A |

FIG. 14

| CODING RATE OF LESS THAN h | METHOD #A |
|---|---|
| CODING RATE OF h OR MORE | METHOD #B |

FIG. 15

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z=16200 BITS | METHOD #A | METHOD #A | METHOD #A | METHOD #A | METHOD #B | METHOD #B | METHOD #B | METHOD #B | METHOD #B |
| z=64800 BITS | METHOD #B | METHOD #B | METHOD #B | METHOD #B | METHOD #B | METHOD #B | METHOD #B | METHOD #B | METHOD #B |

FIG. 16

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z IS 10000 BITS OR MORE AND 20000 BITS OR LESS | METHOD #A | METHOD #A | METHOD #A | METHOD #B | METHOD #B | METHOD #B | METHOD #B | METHOD #B | METHOD #B |
| z IS 50000 BITS OR MORE AND 70000 BITS OR LESS | METHOD #B | METHOD #B | METHOD #B | METHOD #B | METHOD #B | METHOD #B | METHOD #B | METHOD #B | METHOD #B |

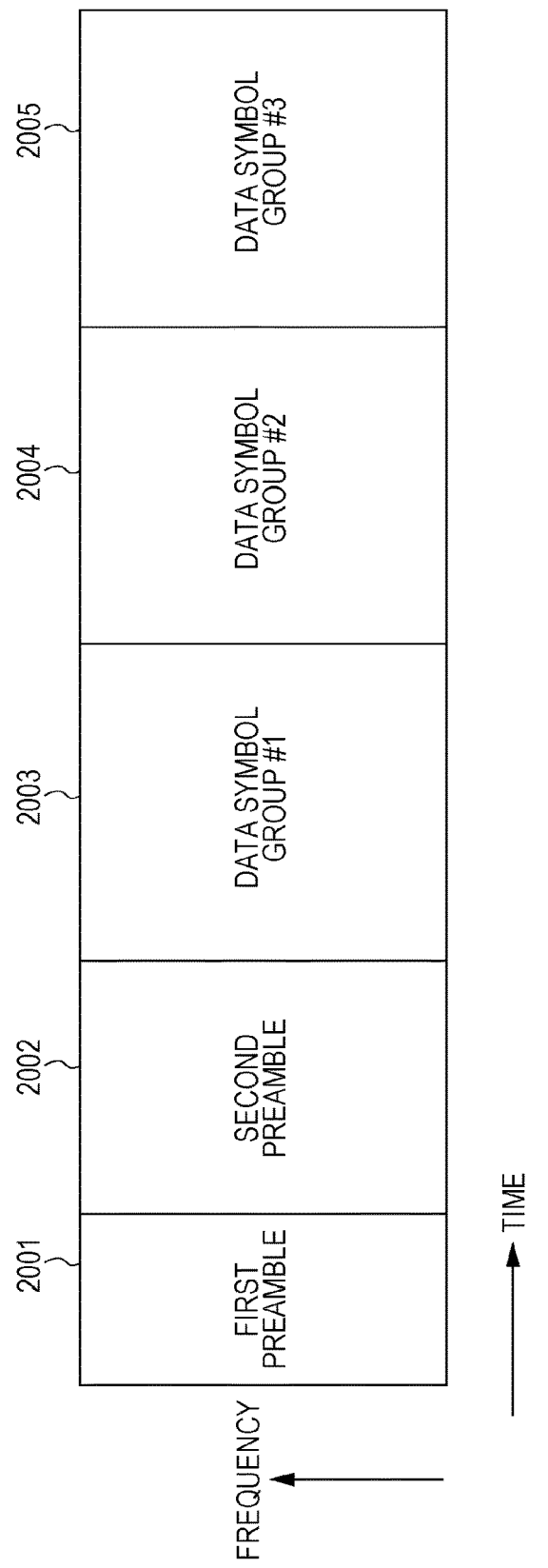

TRANSMISSION METHOD, RECEPTION METHOD, TRANSMISSION DEVICE AND RECEPTION DEVICE

BACKGROUND

1. Technical Field

The present disclosure relates to a broadcast and communication system which uses error correction codes.

2. Description of the Related Art

In a broadcast and communication system which uses radio waves and cables, error correction codes are used in order to improve data reception quality at a reception device. In this case, in consideration of an arithmetic operation scale, it is desirable to use an error correction code of high correction performance. In such a situation, it has been studied to use an LDPC (Low-Density Parity-Check) code in a broadcast and communication system which uses radio waves and cables. In consideration of a variable amount of data transmitted by a transmission device, environment of use (reception in mobile environment or reception in semi-fixed environment) and the like, it has been studied to configure a system in which a block length (code length) of an LDPC code and a coding rate are variable.

Meanwhile, an LDPC code generating method has been variously studied. For example, NPL 1 describes encoding an information sequence and generating and transmitting a codeword of N bits by using an LDPC code defined by parity check matrix H1 (where a number of columns is N).

Moreover, NPL 2 describes encoding an information sequence and generating a codeword of L bits by using an LDPC code defined by parity check matrix H2 (where a number of columns is L and a relationship of N<L holds). Then, NPL 2 describes determining bits not to be transmitted of L−N bits in the codeword of the L bits, and transmitting a sequence of a rest of N bits (puncturing method).

CITATION LIST

Patent Literature

NPL 1: DVB Document A122, Framing structure channel coding and modulation for a second generation digital terrestrial television broadcasting system (DVB-T2), June 2008.

NPL 2: Q. Dia, Y. Y Tai, S. Lin, and K. Abdel-Ghaffar, "LDPC codes on partial geometries: Construction, trapping set structure, and puncturing," IEEE Transaction on Information Theory, vol. 59, no. 12, pp. 7898-7914, December 2013.

SUMMARY

In one general aspect, the techniques disclosed here feature a transmission method using a plurality of coding methods. The transmission method include selecting one coding method from a plurality of coding methods per data symbol group, encoding an information sequence by using the selected coding method to obtain an encoded sequence, modulating the encoded sequence to obtain data symbols, and transmitting a transmission frame that includes a plurality of data symbol groups, each of the plurality of data symbol group including the obtained data symbols. The plurality of coding methods includes at least a first coding method and a second coding method. The first coding method is a coding method with a first coding rate for generating a first encoded sequence by coding a first codeword using a first parity check matrix. The second coding method is a coding method with a second coding rate that is different from the first coding rate and is coding rate after puncturing processing, in which a second encoded sequence is generated by performing the puncturing processing on a second codeword by using a second parity check matrix that is different from the first parity check matrix. Then, a number of bits of the first encoded sequence is equal to a number of bits of the second encoded sequence.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF THE DRAWINGS

FIG. 4 is a view illustrating an example of an operation of the reception device when puncturing is used;

FIG. 5 is a view illustrating an example of a coding method selected for a code length and a coding rate;

FIG. 6 is a view illustrating an example of a coding method selected for a code length and a coding rate;

FIG. 7 is a view illustrating an example of a coding method selected for a code length and a coding rate;

FIG. 8 is a view illustrating an example of a coding method selected for a code length and a coding rate;

FIG. 9 is a view illustrating an example of a coding method selected for a code length;

FIG. 10 is a view illustrating an example of a coding method selected for a code length;

FIG. 12 is a view illustrating an example of a coding method selected for a coding rate;

FIG. 13 is a view illustrating an example of a coding method selected for a coding rate;

FIG. 14 is a view illustrating an example of a coding method selected for a coding rate;

FIG. 15 is a view illustrating an example of a coding method selected for a code length and a coding rate;

FIG. 16 is a view illustrating an example of a coding method selected for a code length and a coding rate;

FIG. 20 is a view illustrating an example of a frame configuration of a modulated signal transmitted by the transmission device.

DESCRIPTION OF EMBODIMENT

Figure 1:
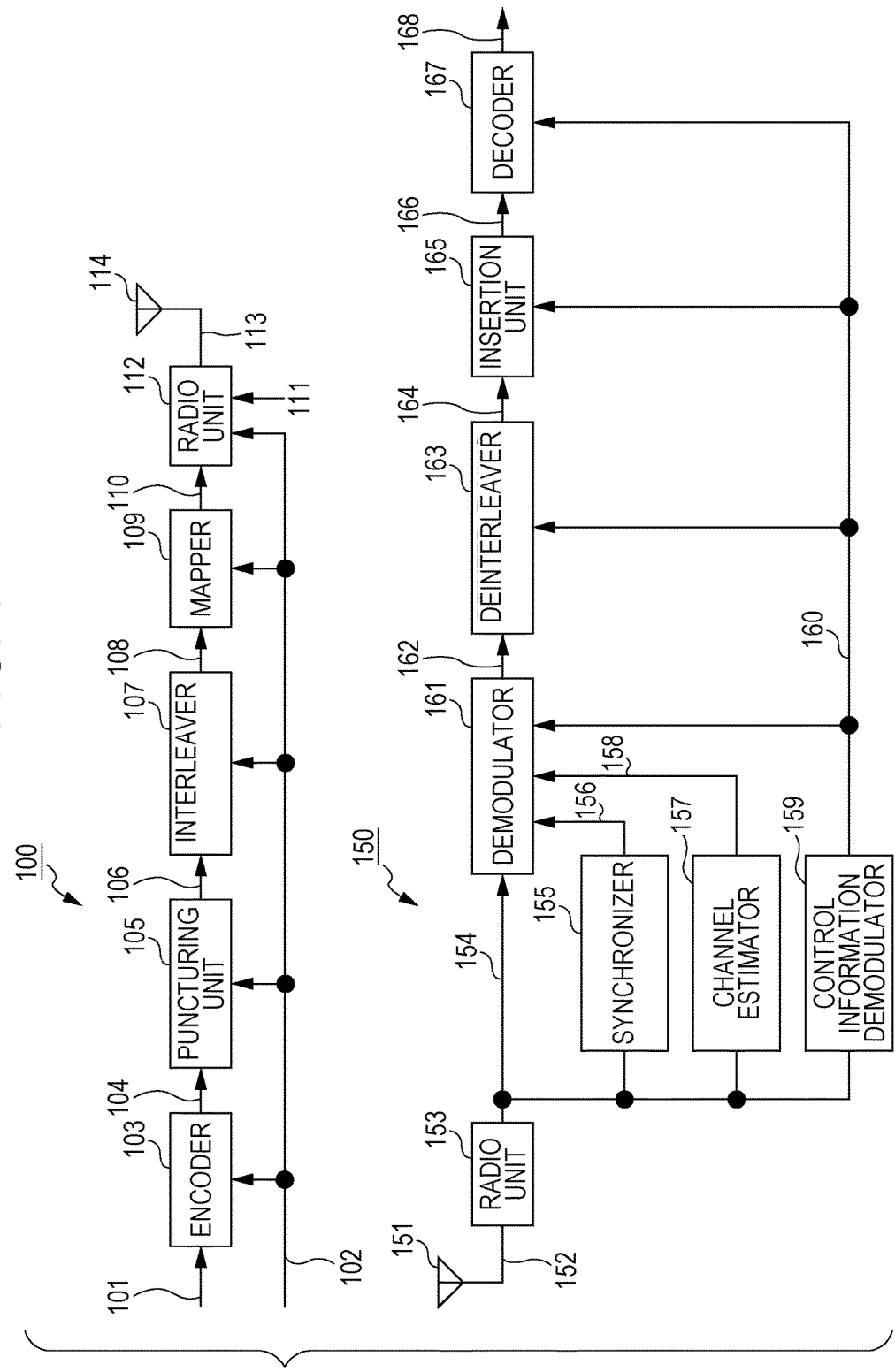
FIG. 1 is a view illustrating an example of a configuration of a reception device and a transmission device which use radio waves.

The present disclosure relates to a setting of an LDPC code used in a broadcast and communication system in which a block length (code length) and a coding rate are variable and which uses radio waves and cables, such that a reception device obtains higher data reception quality in the broadcast and communication system.

One aspect of the present disclosure is a transmission method using a plurality of coding methods. The transmission method includes an encoding step of selecting one coding method from a plurality of coding methods by a unit of a data symbol group, encoding an information sequence by using the selected coding method, and obtaining an encoded sequence, a modulation step of modulating the encoded sequence and obtaining a data symbol, and a transmission step of transmitting a transmission frame configured to include a plurality of data symbol groups including a plurality of the data symbols. The plurality of coding methods includes at least a first coding method and a second coding method. The first coding method is a coding method of a first coding rate for forming a generated first codeword into a first encoded sequence by using a first parity check matrix. The second coding method is a coding method of a second coding rate different from the first coding rate and obtained after puncturing processing, in which a second encoded sequence is generated by performing the puncturing processing on a generated second codeword by using a second parity check matrix different from the first parity check matrix. Then, a number of bits of the first encoded sequence is equal to a number of bits of the second encoded sequence.

One aspect of the present disclosure is a reception method using a plurality of decoding methods. The reception method includes a demodulation step of demodulating a received signal, and a decoding step of performing error correction decoding on a plurality of reception values generated by the demodulation. The received signal includes a plurality of data symbol groups including a plurality of data symbols and configures a frame, and the data symbols are encoded by switching coding methods by a unit of the data symbol groups. When the plurality of reception values is values encoded by a first coding method, a first decoding method corresponding to the first coding method is applied to the plurality of reception value. Moreover, when the plurality of reception values is values encoded by a second coding method, depuncturing processing is applied to the plurality of reception values, and a second decoding method corresponding to the second coding method is applied to a plurality of values obtained after the depuncturing processing. The first coding method is a coding method of a first coding rate for forming a generated first codeword into a first encoded sequence by using a first parity check matrix. The second coding method is a coding method of a second coding rate different from the first coding rate and obtained after puncturing processing, in which a second encoded sequence is generated by performing the puncturing processing on a generated second codeword by using a second parity check matrix different from the first parity check matrix. Then, a number of bits of the first encoded sequence is equal to a number of bits of the second encoded sequence.

One aspect of the present disclosure is a transmission device using a plurality of coding methods. The transmission device includes an encoder that selects one coding method from a plurality of coding methods by a unit of a data symbol group, encodes an information sequence by using the selected coding method, and obtains an encoded sequence a modulator that modulates the encoded sequence and obtains a data symbol and a transmitter that transmits a transmission frame configured to include a plurality of data symbol groups including a plurality of the data symbols. The plurality of coding methods includes at least a first coding method and a second coding method. The first coding method is a coding method of a first coding rate for forming a generated first codeword into a first encoded sequence by using a first parity check matrix. The second coding method is a coding method of a second coding rate different from the first coding rate and obtained after puncturing processing, in which a second encoded sequence is generated by performing the puncturing processing on a generated second codeword by using a second parity check matrix different from the first parity check matrix. Then, a number of bits of the first encoded sequence is equal to a number of bits of the second encoded sequence.

One aspect of the present disclosure is a reception device using a plurality of decoding methods. The reception device includes a demodulator that demodulates a received signal, and a decoder that performs error correction decoding on a plurality of reception values generated by the demodulator. The received signal includes a plurality of data symbol groups including a plurality of data symbols and configures a frame, and the data symbols are encoded by switching coding methods by a unit of the data symbol groups. When the plurality of reception values is values encoded by a first coding method, the decoder applies a first decoding method corresponding to the first coding method to the plurality of reception values. Moreover, when the plurality of reception values is values encoded by a second coding method, the decoder applies depuncturing processing to the plurality of reception values, and applies the second decoding method corresponding to the second coding method to a plurality of values obtained after the depuncturing processing. The first coding method is a coding method of a first coding rate for forming a generated first codeword into a first encoded sequence by using a first parity check matrix. The second coding method is a coding method of a second coding rate different from the first coding rate and obtained after puncturing processing, in which a second encoded sequence is generated by performing the puncturing processing on a generated second codeword by using a second parity check matrix different from the first parity check matrix. Then, a number of bits of the first encoded sequence is equal to a number of bits of the second encoded sequence.

FIG. 1 illustrates an example of a configuration of a system which includes transmission device 100 and reception device 150, and which uses radio waves. Note that FIG. 1 illustrates the system which uses radio waves. However, the system is not limited to this, and may be a system which uses cables (coaxial cables, cables, light or the like).

Encoder 103 receives an input of information 101 and control information 102, performs error correction coding based on information of a code included in control information 102 and used for the error correction coding by a transmission device, such as information of a coding rate and a code length (block length), and outputs data 104 obtained after the error correction coding.

Puncturing unit 105 receives an input of control information 102 and data 104 obtained after the error correction coding, determines whether or not to puncture data 104 obtained after the error correction coding (whether or not to delete part of a bit sequence) based on the information of the code included in control information 102 and used for the error correction coding by the transmission device such as information of a coding rate and a code length (block length), and outputs data 106.

Interleaver 107 receives an input of control information 102 and data 106, rearranges data based on information included in control information 102 and related to an interleaving method, and outputs rearranged data 108.

Mapper 109 receives an input of control information 102 and rearranged data 108, performs mapping based on information included in control information 102 and related to a modulation method, and outputs baseband signal 110.

Radio unit 112 receives an input of control information 102, baseband signal 110 and pilot signal 111. Radio unit 112 performs processing such as inserting a control information symbol demodulated from control information 102 by a receiver (including information related to a modulation method, an error correction coding method or the like), a pilot symbol and the like into a data symbol, and generates a frame. Moreover, radio unit 112 performs signal processing based on control information 102 (for example, radio unit 112 performs signal processing based on OFDM (Orthogonal Frequency Division Multiplexing) when OFDM is used, or performs signal processing based on an MIMO (Multiple Input-Multiple-Output) method when the MIMO method is used, or performs processing such as frequency conversion, band limitation and amplification), and outputs transmission signal 113. Transmission signal 113 is output as a radio wave from antenna 114 (note that a number of antennas described herein is two, but is not limited to this).

FIG. 1 illustrates an example of a configuration of reception device 150 which receives a modulated signal transmitted by transmission device 100.

Radio unit 153 performs processing such as frequency conversion on received signal 152 received at antenna 151, and outputs baseband signal 154.

Synchronizer 155 receives an input of baseband signal 154, performs processing for frequency synchronization and time synchronization by using a pilot symbol, a preamble and the like included in a baseband signal, and outputs synchronization signal 156.

Channel estimator 157 receives an input of baseband signal 154, performs channel estimation by using a pilot symbol, a preamble and the like included in a baseband signal, and outputs channel estimation signal 15.

Control information demodulator 159 receives an input of baseband signal 154, demodulates a control information symbol included in the baseband signal, and outputs control information signal 160.

Demodulator 161 receives an input of baseband signal 154, synchronization signal 156, channel estimation signal 158 and control information signal 160, calculates, for example, a log likelihood ratio of each bit of a data symbol included in baseband signal 154 by using synchronization signal 156 and channel estimation signal 158 based on information included in control information signal 160 and related to a transmission method such as a modulation method, and outputs log likelihood ratio signal 162.

Deinterleaver 163 receives an input of control information signal 160 and log likelihood ratio signal 162, rearranges an order of log likelihood ratios based on information included in control information signal 160 and related to an interleaving method, and outputs rearranged log likelihood ratio signal 164.

Insertion unit 165 receives an input of control information signal 160, and determines whether the transmission device has performed puncturing or has not performed the puncturing (whether the transmission device has deleted part of a bit sequence or has not deleted part of the bit sequence) based on information of a block length (code length) and a coding rate of an error correction code in control information signal 160.

When it is determined that the "transmission device has performed the puncturing," insertion unit 165 inserts into rearranged log likelihood ratio signal 164 a log likelihood ratio (for example, a value of "O") corresponding to a bit punctured (deleted) by the transmission device.

When it is determined that the "transmission device has not performed the puncturing," insertion unit 165 does not insert the above-described log likelihood ratio.

Then, insertion unit 165 outputs second log likelihood ratio signal 166.

Decoder 167 receives an input of control information signal 160 and second log likelihood ratio signal 166, performs error correction decoding based on information included in the control information signal and related to an error correction code, and outputs received data 168. Note that according to the present disclosure, since the LDPC code is used, belief propagation (BP) decoding (for example, sum-product decoding, min-sum decoding or Laired BP decoding) is performed based on a parity check matrix.

Figure 2:
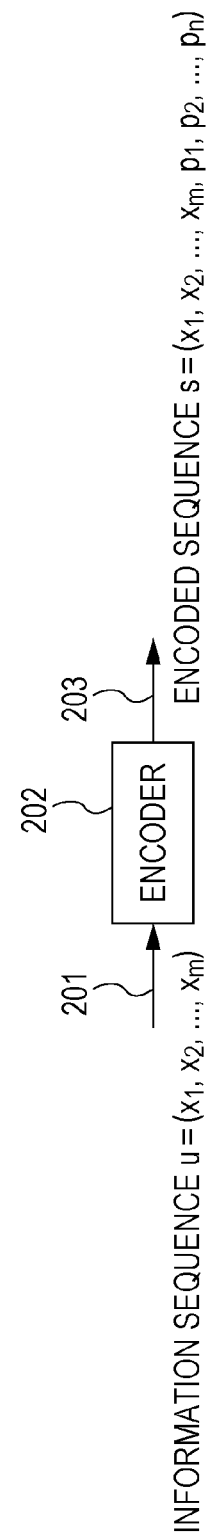
FIG. 2 is a view illustrating an example of a configuration of an encoder.

An LDPC code will be described. FIG. 2 illustrates a configuration of the encoder. When an information sequence is $u=(x_1, x_2, \ldots, x_m)$ (201), an encoded sequence is $s=(x_1, x_2, \ldots, x_m, p_1, p_2, \ldots, p_n)$ (203) and a parity check matrix is H, a following equation holds. (m is a natural number, and n is a natural number).

$$Hs^T = 0$$

By using a relationship of the above-described equation, encoder 202 receives an input of information sequence $u=(x_1, x_2, \ldots, x_m)$, and generates and outputs encoded sequence $s=(x_1, x_2, \ldots, x_m, p_1, p_2, \ldots, p_n)$. Note that coding rate $R=m/(m+n)$ holds. Note that $(p_1, p_2, \ldots, p_n)$ will be referred to as a parity sequence.

Hence, the transmission device transmits a total of m+n bits of $(x_1, x_2, \ldots, x_m, p_1, p_2, \ldots, p_n)$ as one encoded block.

In this case, a number of rows of parity check matrix H is n, and a number of columns is m+n.

Note that a case where encoding is performed as in FIG. 2 will be referred to as the "LDPC coding method which does not perform puncturing."

Next, the LDPC code using puncturing will be described.

Figure 3:
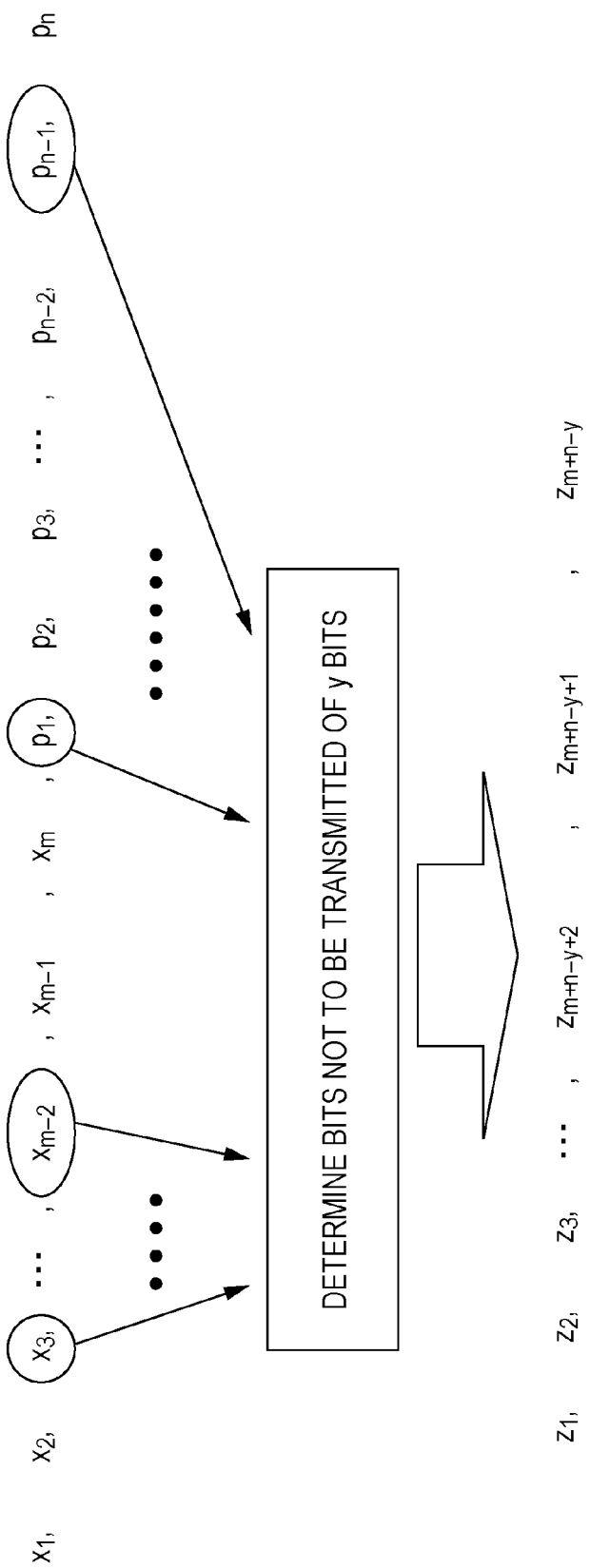
FIG. 3 is a view illustrating an example of an operation of the transmission device when puncturing is used.

The transmission device determines bits not to be transmitted of y bits in encoded sequence $s=(x_1, x_2, \ldots, x_m, p_1, p_2, \ldots, p_n)$ in the above-described LDPC code, and the transmission device transmits a sequence of m+n−y bits other than the determined bits. FIG. 3 illustrates a specific example of the LDPC code using puncturing.

In FIG. 3, for example, the transmission device selects a total of y bits of "$x_3, \ldots, x_{m-2}, p_1, \ldots, p_{n-1}$," determines not to transmit these y bits, and transmits sequence $z_1, z_2, z_3, \ldots, z_{m+n-y+2}, z_{m+n-y+1}, z_{m+n-y}$ of a total of the m+n−y bits other than the bits determined not to be transmitted.

Note that in an example in FIG. 3, the y bits not to be transmitted are selected from both of an information sequence and a parity sequence, but are not limited to this and may be selected only from an information sequence or may be selected only from a parity sequence. That is, the y bits not to be transmitted may be selected from an encoded sequence in any way.

Hence, the transmission device transmits a total of the m+n−y bits of $(z_1, z_2, z_3, \ldots, z_{m+n-y+2}, z_{m+n-y+1}, z_{m+n-y})$ as one encoded block.

Note that hereinafter, the above-described method will be referred to as the "LDPC coding method using puncturing."

FIG. 4 illustrates an example of an operation example of the reception device when the transmission device transmits data as illustrated in FIG. 3.

The reception device receives sequence $z_1, z_2, z_3, \ldots, z_{m+n-y+2}, z_{m+n-y+1}, z_{m+n-y}$, and sets log likelihood ratios of these bits to $Lz_1, Lz_2, Lz_3, \ldots, Lz_{m+n-y+2}, Lz_{m+n-+1}, Lz_{m+n-y}$.

As illustrated in FIG. 4, the reception device sets to "0 (zero)" the log likelihood ratio of each bit of a total of the y bits of "$x_3, \ldots, x_{m-2}, p_1, \ldots, p_{n-1}$" which are not transmitted by the transmission device. Therefore, the "log likelihood ratio of $x_3=0, \ldots,$ the log likelihood ratio of $x_{m-2}=0$, the log likelihood ratio of $p_1=0, \ldots,$ the log likelihood ratio of $p_{n-1}=0$" are inserted. Hence, log likelihood ratios $Lx_1, Lx_2, Lx_3, \ldots, Lx_{m-2}, Lx_{m-1}, Lx_m, Lp_1, Lp_2, Lp_3, \ldots, Lp_{n-2}, Lp_{n-1}, Lp_n$ of bits of $x_1, x_2, x_3, \ldots, x_{m-2}, x_{m-1}, x_m, p_1, p_2, p_3, \ldots, p_{n-2}, p_{n-1}, p_n$ are obtained. Then, the reception device performs BP decoding by using $Lx_1, Lx_2, Lx_3, \ldots, Lx_{m-2}, Lx_{m-1}, Lx_m, Lp_1, Lp_2, Lp_3, \ldots, Lp_{n-2}, Lp_{n-1}, Lp_n$, and obtains received data.

Next, a case where the transmission device supports α bits and β bits as numbers of bits of one encoded block for coding rate R=γ will be discussed. Note that α and β are natural numbers, and α<β holds.

In a case of the "LDPC coding method using puncturing," an LDPC code of a code length (block length) of α+v bits (where v is a natural number) and coding rate q (where q<γ) is used for coding rate R=γ and the α bits of one encoded block. Subsequently, puncturing is performed. Note that this method will be referred to as "method #1."

Similarly, in a case of the "LDPC coding method using puncturing," an LDPC code of a code length (block length) of β+u bits (where u is a natural number) and coding rate q (where q<γ) is used for coding rate R=γ and the β bits of one encoded block. Subsequently, puncturing is performed. Note that this method will be referred to as "method #2."

By contrast with this, in a case of the "LDPC coding method which does not perform puncturing," an LDPC code of a code length (block length) of the α bits and coding rate γ is used for coding rate R=γ and the α bits of one encoded block. Note that this method will be referred to as "method #3."

Similarly, in a case of the "LDPC coding method which does not perform puncturing," an LDPC code of a code length (block length) of the β bits and coding rate γ is used for coding rate R=γ and the β bits of one encoded block. Note that this method will be referred to as "method #4."

Under a condition that a relationship of α<β holds, discussion will be made.

In this case, when the number of bits of one encoded block is the α bits, there is a case where "method #1" provides higher data reception quality than data reception quality in "method #3."

On the other hand, when the number of bits of one encoded block is 3, there is a case where "method #4" provides higher data reception quality than data reception quality in "method #2."

A reason for this will be described below.

In a case of "method #1," an LDPC code with a code length (block length) of α+v bits that is larger than α is used in order to realize the α bits as the number of bits of one encoded block. Here, α<β holds, and in a case where a is small, the degree of contribution made by an added value of v in the code length (block length) of the α+v bits is large. For this reason, there is a case where high data reception quality is obtained when "method #1" is used, as compared to data reception quality obtained when the LDPC code of the code length (block length) of the α bits is used.

On the other hand, in a case of "method #2," an LDPC code with a code length (block length) of β+u bits that is larger than β is used to realize the β bits as the number of bits of one encoded block. Here, α<β holds, and in a case where β is large, the degree of contribution made by an added value in the code length (block length) of the β+u bits is small, and puncturing causes significant deterioration. Therefore, there is a case where use of an LDPC code of the code length (block length) of the β bits, that is, "method #4" provides higher data reception quality than data reception quality in "method #2."

Here, data reception quality depends on specific values of α and β. (Moreover, the values of α and β are likely to change depending on a coding rate.) A specific example will be described below.

FIG. 5 is an example illustrating which one of "method #A" and "method #B" is used for number of bits z and a coding rate of one encoded block. Note that in a case of "method #A," a coding rate means a coding rate obtained after puncturing (after bits not to be transmitted are deleted) instead of a coding rate of the LDPC code.

In the example in FIG. 5, in a case of one encoded block z=8100 bits, "method #A" realizes all of coding rates 5/15, 6/15, 7/15, 8/15, 9/15, 10/15, 11/15, 12/15 and 13/15.

Then, in a case of one encoded block z=16200 bits, "method #A" realizes all of coding rates 5/15, 6/15, 7/15, 8/15, 9/15, 10/15, 11/15, 12/15 and 13/15.

In a case of one encoded block z=64800 bits, "method #B" realizes all of coding rates 5/15, 6/15, 7/15, 8/15, 9/15, 10/15, 11/15, 12/15 and 13/15.

In this case, when a number of bits of one encoded block is a certain value, "method #A in a case of coding rate a" and "method #A in a case of coding rate b" (where a≠b) will be described. (Here, any of coding rate a and coding rate b is a coding rate obtained after puncturing (after bits not to be transmitted are deleted).) In this case, there are a and b satisfying one of following conditions.

Condition 5-1: An LDPC code that is a base of "method #A in a case of coding rate a" and an LDPC code that is a base of "method #A in a case of coding rate b" are different codes.

Condition 5-2: A parity check matrix of an LDPC code that is a base of "method #A in a case of coding rate a" and a parity check matrix of an LDPC code that is a base of "method #A in a case of coding rate b" are different.

Condition 5-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 5-4: A number of columns of a parity check matrix of an LDPC code that is a base of "method #A in a case of coding rate a" and a number of columns of a parity check matrix of an LDPC code that is a base of "method #A in a case of coding rate b" are different.

A number of bits of one encoded block is z bits. Note that z is a natural number.

The z bits of one encoded block are realized by using an "LDPC coding method using puncturing." Note that this method will be referred to as "method #A."

The z bits of one encoded block are realized by using an "LDPC coding method which does not perform puncturing." Note that this method will be referred to as "method #B."

The transmission device and the reception device set a coding rate from coding rates illustrated in FIG. 6, and also select one encoded block from the number of bits of one encoded block illustrated in FIG. 6.

FIG. 6 is an example illustrating which one of "method #A" and "method #B" is used for number of bits z and a coding rate of one encoded block. Note that in a case of "method #A," a coding rate means a coding rate obtained after puncturing (after bits not to be transmitted are deleted) instead of a coding rate of the LDPC code.

In the example in FIG. 6, in a case of one encoded block z=8100 bits, "method #A" realizes all of coding rates 5/15, 6/15, 7/15, 8/15, 9/15, 10/15, 11/15, 12/15 and 13/15.

Then, in a case of one encoded block z=16200 bits, "method #B" realizes all of coding rates 5/15, 6/15, 7/15, 8/15, 9/15, 10/15, 11/15, 12/15 and 13/15.

In a case of one encoded block z=64800 bits, "method #B" realizes all of coding rates 5/15, 6/15, 7/15, 8/15, 9/15, 10/15, 11/15, 12/15 and 13/15.

In this case, when a number of bits of one encoded block is a certain value, "method #A in a case of coding rate a" and "method #A in a case of coding rate b" (where a≠b) will be discussed. (Here, any of coding rate a and coding rate b is a coding rate obtained after puncturing (after bits not to be transmitted are deleted).) In this case, there are a and b satisfying one of following conditions.

Condition 6-1: An LDPC code that is a base of "method #A in a case of coding rate a" and an LDPC code that is a base of "method #A in a case of coding rate b" are different codes.

Condition 6-2: A parity check matrix of an LDPC code that is a base of "method #A in a case of coding rate a" and a parity check matrix of an LDPC code that is a base of "method #A in a case of coding rate b" are different.

Condition 6-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 6-4: A number of columns of a parity check matrix of an LDPC code that is a base of "method #A in a case of coding rate a" and a number of columns of a parity check matrix of an LDPC code that is a base of "method #A in a case of coding rate b" are different.

A number of bits of one encoded block is z bits. Note that z is a natural number.

The z bits of one encoded block are realized by using an "LDPC coding method using puncturing." Note that this method will be referred to as "method #A."

The z bits of one encoded block are realized by using an "LDPC coding method which does not perform puncturing." Note that this method will be referred to as "method #B."

The transmission device and the reception device set a coding rate from coding rates illustrated in FIG. 7, and also select one encoded block from the number of bits of one encoded block illustrated in FIG. 7.

FIG. 7 is an example illustrating which one of "method #A" and "method #B" is used for number of bits z and a coding rate of one encoded block. Note that in a case of "method #A," a coding rate means a coding rate obtained after puncturing (after bits not to be transmitted are deleted) instead of a coding rate of the LDPC code.

In the example in FIG. 7, when one encoded block z is 1000 bits or more and 9000 bits or less, "method #A" realizes all of coding rates 5/15, 6/15, 7/15, 8/15, 9/15, 10/15, 11/15, 12/15 and 13/15.

Then, when one encoded block z is 10000 bits or more and 20000 bits or less, "method #A" realizes all of coding rates 5/15, 6/15, 7/15, 8/15, 9/15, 10/15, 11/15, 12/15 and 13/15.

When one encoded block z is 50000 bits or more and 70000 bits or less, "method #B" realizes all of coding rates 5/15, 6/15, 7/15, 8/15, 9/15, 10/15, 11/15, 12/15 and 13/15.

In this case, when a number of bits of one encoded block is a certain value, "method #A in a case of coding rate a" and "method #A in a case of coding rate b" (where a≠b) will be discussed. (Here, any of coding rate a and coding rate b is a coding rate obtained after puncturing (after bits not to be transmitted are deleted).) In this case, there are a and b satisfying one of following conditions.

Condition 7-1: An LDPC code that is a base of "method #A in a case of coding rate a" and an LDPC code that is a base of "method #A in a case of coding rate b" are different codes.

Condition 7-2: A parity check matrix of an LDPC code that is a base of "method #A in a case of coding rate a" and a parity check matrix of an LDPC code that is a base of "method #A in a case of coding rate b" are different.

Condition 7-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 7-4: A number of columns of a parity check matrix of an LDPC code that is a base of "method #A in a case of coding rate a" and a number of columns of a parity check matrix of an LDPC code that is a base of "method #A in a case of coding rate b" are different.

A number of bits of one encoded block is z bits. Note that z is a natural number.

The z bits of one encoded block are realized by using an "LDPC coding method using puncturing." Note that this method will be referred to as "method #A."

The z bits of one encoded block are realized by using an "LDPC coding method which does not perform puncturing." Note that this method will be referred to as "method #B."

The transmission device and the reception device set a coding rate from coding rates illustrated in FIG. 8, and also select one encoded block from the number of bits of one encoded block illustrated in FIG. 8.

FIG. 8 is an example illustrating which one of "method #A" and "method #B" is used for number of bits z and a coding rate of one encoded block. Note that in a case of "method #A," a coding rate means a coding rate obtained after puncturing (after bits not to be transmitted are deleted) instead of a coding rate of the LDPC code.

In the example in FIG. 8, when number of bits z of one encoded block is 1000 bits or more and 9000 bits or less, "method #A" realizes all of coding rates 5/15, 6/15, 7/15, 8/15, 9/15, 10/15, 11/15, 12/15 and 13/15.

Then, when number of bits z of one encoded block is 10000 bits or more and 20000 bits or less, "method #B" realizes all of coding rates 5/15, 6/15, 7/15, 8/15, 9/15, 10/15, 11/15, 12/15 and 13/15.

When one encoded block z is 50000 bits or more and 70000 bits or less, "method #B" realizes all of coding rates 5/15, 6/15, 7/15, 8/15, 9/15, 10/15, 11/15, 12/15 and 13/15.

In this case, when a number of bits of one encoded block is a certain value, "method #A in a case of coding rate a" and "method #A in a case of coding rate b" (where a≠b) will be discussed. (Here, any of coding rate a and coding rate b is a coding rate obtained after puncturing (after bits not to be transmitted are deleted).) In this case, there are a and b satisfying one of following conditions.

Condition 8-1: An LDPC code that is a base of "method #A in a case of coding rate a" and an LDPC code that is a base of "method #A in a case of coding rate b" are different codes.

Condition 8-2: A parity check matrix of an LDPC code that is a base of "method #A in a case of coding rate a" and a parity check matrix of an LDPC code that is a base of "method #A in a case of coding rate b" are different.

Condition 8-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 8-4: A number of columns of a parity check matrix of an LDPC code that is a base of "method #A in a case of coding rate a" and a number of columns of a parity check matrix of an LDPC code that is a base of "method #A in a case of coding rate b" are different.

A number of bits of one encoded block is z bits. Note that z is a natural number.

The z bits of one encoded block are realized by using an "LDPC coding method using puncturing." Note that this method will be referred to as "method #A."

The z bits of one encoded block are realized by using an "LDPC coding method which does not perform puncturing." Note that this method will be referred to as "method #B."

The transmission device and the reception device select one encoded block from the number of bits of one encoded block illustrated in FIG. 9. Note that a coding rate can also be set.

FIG. 9 is an example illustrating which one of "method #A" and "method #B" is used for number of bits z of one encoded block. Note that in a case of "method #A," a coding rate means a coding rate obtained after puncturing (after bits not to be transmitted are deleted) instead of a coding rate of the LDPC code.

In the example in FIG. 9, when one encoded block z is less than 20000 bits, "method #A" is used.

Then, when one encoded block z is 20000 bits or more, "method #B" is used.

In this case, when a number of bits of one encoded block is a certain value, "method #A in a case of coding rate a" and "method #A in a case of coding rate b" (where a≠b) will be discussed. (Here, any of coding rate a and coding rate b is a coding rate obtained after puncturing (after bits not to be transmitted are deleted).) In this case, there are a and b satisfying one of following conditions.

Condition 9-1: An LDPC code that is a base of "method #A in a case of coding rate a" and an LDPC code that is a base of "method #A in a case of coding rate b" are different codes.

Condition 9-2: A parity check matrix of an LDPC code that is a base of "method #A in a case of coding rate a" and a parity check matrix of an LDPC code that is a base of "method #A in a case of coding rate b" are different.

Condition 9-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 9-4: A number of columns of a parity check matrix of an LDPC code that is a base of "method #A in a case of coding rate a" and a number of columns of a parity check matrix of an LDPC code that is a base of "method #A in a case of coding rate b" are different.

A number of bits of one encoded block is z bits. Note that z is a natural number.

The z bits of one encoded block are realized by using an "LDPC coding method using puncturing." Note that this method will be referred to as "method #A."

The z bits of one encoded block are realized by using an "LDPC coding method which does not perform puncturing." Note that this method will be referred to as "method #B."

The transmission device and the reception device select one encoded block from the number of bits of one encoded block illustrated in FIG. 10. Note that a coding rate can also be set.

FIG. 10 is an example illustrating which one of "method #A" and "method #B" is used for number of bits z of one encoded block. Note that in a case of "method #A," a coding rate means a coding rate obtained after puncturing (after bits not to be transmitted are deleted) instead of a coding rate of the LDPC code.

In the example in FIG. 10, when one encoded block z is less than 10000 bits, "method #A" is used.

Then, when one encoded block z is 10000 bits or more, "method #B" is used.

In this case, when a number of bits of one encoded block is a certain value, "method #A in a case of coding rate a" and "method #A in a case of coding rate b" (where a≠b) will be discussed. (Here, any of coding rate a and coding rate b is a coding rate obtained after puncturing (after bits not to be transmitted are deleted).) In this case, there are a and b satisfying one of following conditions.

Condition 10-1 An LDPC code that is a base of "method #A in a case of coding rate a" and an LDPC code that is a base of "method #A in a case of coding rate b" are different codes.

Condition 10-2: A parity check matrix of an LDPC code that is a base of "method #A in a case of coding rate a" and a parity check matrix of an LDPC code that is a base of "method #A in a case of coding rate b" are different.

Condition 10-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 10-4: A number of columns of a parity check matrix of an LDPC code that is a base of "method #A in a case of coding rate a" and a number of columns of a parity check matrix of an LDPC code that is a base of "method #A in a case of coding rate b" are different.

Figure 11:
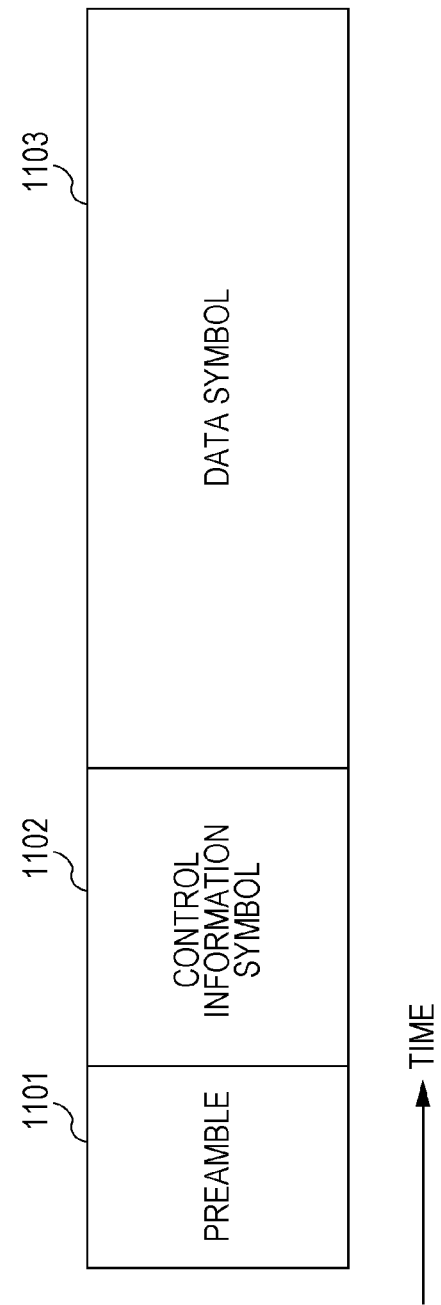
FIG. 11 is a view illustrating an example of a configuration of a frame transmitted by the transmission device.

FIG. 11 is an example of a configuration of a frame transmitted by the transmission device, and in FIG. 11 a horizontal axis is time. FIG. 11 is an example where a transmission method which uses, for example, a single carrier is used. However, when a multi-carrier method such as OFDM (Orthogonal Frequency Division Multiplexing) is used, there is a plurality of carriers in a frequency direction, and there are symbols in a carrier direction. Moreover, when, for example, a space-time code or an MIMO (Multiple Input-Multiple-Output) method is used, there is a frame per stream.

In FIG. 11, preamble 1101 uses, for example, a PSK (Phase Shift Keying) modulated symbol which is known in a transmitter and a receiver. The receiver performs frequency offset estimation, frequency synchronization, time synchronization, frame synchronization, channel estimation, signal detection and the like by using this symbol.

Control information symbol 1102 includes, for example, information of an error correction code method (a code length, a block length of one encoded block, and a coding rate of one encoded block) used for generating a data symbol, information of a modulation method used for generating a data symbol, and information related to the transmission method. The reception device obtains the control information by demodulating this symbol, and, consequently, demodulation and error correction decoding of the data symbol become possible.

Moreover, whether or not to insert a log likelihood ratio described with reference to FIG. 1 is controlled based on the information obtained in control information symbol 1102.

Data symbol 1103 is generated based on an error correction coding method (a code length, a block length of one encoded block, and a coding rate of one encoded block), a modulation method and a transmission method selected by the transmission device. Note that although not illustrated in FIG. 11, a symbol such as a pilot symbol may be inserted into symbols described as control information symbol 1102 and data symbol 1103.

Hence, a frame configuration is not limited to the configuration in FIG. 11.

The transmission device can select a value of one encoded block of data to be transmitted from a plurality of values and provides a threshold. When one encoded block of data transmitted by the transmission device is the threshold or more, the transmission device selects the "LDPC coding method which does not perform puncturing" and transmits data. When the one encoded block is less than the threshold, the transmission device selects the "LDPC coding method using puncturing" and transmits data. Consequently, the reception device can obtain an effect of obtaining high data reception quality at any value of one encoded block.

Next, a case where the transmission device supports coding rates $\alpha$, $\beta$ and $\gamma$ for numbers of bits $\delta$ of one encoded block. Note that $\alpha$, $\beta$ and $\gamma$ are values larger than 0 and smaller than 1, and $\alpha<\beta<\gamma$ holds. Note that a coding rate in a case of the "LDPC coding method using puncturing" means a coding rate obtained after puncturing (after bits not to be transmitted are deleted).

In a case of the "LDPC coding method using puncturing," an LDPC code of a code length (block length) of $\delta+u$ bits (where u is a natural number) and coding rate a (where $a<\alpha$) is used for coding rate $R=\alpha$ and the $\delta$ bits of one encoded block. Subsequently, puncturing is performed. Note that this method will be referred to as "method $1."

Similarly, in a case of the "LDPC coding method using puncturing," an LDPC code of a code length (block length) of $\delta+v$ bits (where v is a natural number) and coding rate b (where $b<\beta$) is used for coding rate $R=\beta$ and the $\delta$ bits of one encoded block. Subsequently, puncturing is performed. Note that this method will be referred to as "method $2."

In a case of the "LDPC coding method using puncturing," an LDPC code of a code length (block length) of $\delta+w$ bits (where w is a natural number) and coding rate c (where $c<\gamma$) is used for coding rate $R=\gamma$ and the $\delta$ bits of one encoded block. Subsequently, puncturing is performed. Note that this method will be referred to as "method $3."

By contrast with this, in a case of the "LDPC coding method which does not perform puncturing," an LDPC code of a code length (block length) of $\delta$ bits and coding rate $\alpha$ is used for coding rate $R=\alpha$ and the $\delta$ bits of one encoded block. Note that this method will be referred to as "method $4."

Similarly, in a case of the "LDPC coding method which does not perform puncturing," an LDPC code of a code length (block length) of the $\delta$ bits and coding rate $\beta$ is used for coding rate $R=\beta$ and the $\delta$ bits of one encoded block. Note that this method will be referred to as "method $5."

In a case of the "LDPC coding method which does not perform puncturing," an LDPC code of a code length (block length) of the $\delta$ bits and coding rate $\gamma$ is used for coding rate $R=\gamma$ and the $\delta$ bits of one encoded block. Note that this method will be referred to as "method $6."

Under a condition that a relationship of $\alpha<\beta<\gamma$ holds, discussion will be made.

In this case, when the coding rate is as small as $\alpha$, there is a case where "method $4" provides higher data reception quality than data reception quality in "method $1."

When the coding rate is an intermediate value like $\beta$, there is a case where "method $2" provides higher data reception quality than data reception quality in "method $5."

When the coding rate is as large as $\gamma$, there is a case where "method $6" provides higher data reception quality than data reception quality in "method $3."

A reason for this will be described below.

Performance of an LDPC code of a low coding rate tends to have an expanding difference from Shannon limits. Hence, in a case of a small (low) coding rate such as coding rate $\alpha$ and in a case of "method $1," a coding rate of a base LDPC code is smaller than $\alpha$. For this reason, the difference from Shannon limits is large and, when puncturing is performed, it is difficult to obtain good data reception quality.

In a case of an intermediate coding rate such as coding rate $\beta$ and in a case of "method $2," there is a large difference between a Shannon limit of the coding rate of the base LDPC code and a Shannon limit of the punctured coding rate. For this reason, performance of the base LDPC code makes contribution, and "method $2" is highly likely to provide high data reception quality.

In a case of a high coding rate such as coding rate $\gamma$ and in a case of "method $3," there is a small difference between a Shannon limit of the coding rate of the base LDPC code and a Shannon limit of the punctured coding rate. For this reason, "method $3" is likely to have difficulty in obtaining high data reception quality. However, as compared to "method $6," "method $3" has an advantage of being capable of using a sparse parity check matrix. Consequently, "method $3" is likely to provide good reception quality.

Here, data reception quality depends on specific values of $\alpha$, $\beta$ and $\gamma$. (Moreover, the values of $\alpha$, $\beta$ and $\gamma$ are likely to change depending on a value of one encoded block.) A specific example will be described below.

A number of bits of one encoded block is z bits. Note that z is a natural number.

The z bits of one encoded block are realized by using an "LDPC coding method using puncturing." Note that this method will be referred to as "method #A."

The z bits of one encoded block are realized by using an "LDPC coding method which does not perform puncturing." Note that this method will be referred to as "method #B."

The transmission device and the reception device select a coding rate from coding rates illustrated in FIG. 12. Note that the number of bits of one encoded block can also be set.

FIG. 12 is an example illustrating which one of "method #A" and "method #B" is used when number of bits z of one encoded block is set to a certain value. Note that in a case of "method #A," a coding rate means a coding rate obtained after puncturing (after bits not to be transmitted are deleted) instead of a coding rate of the LDPC code.

In FIG. 12, e and f are larger than 0 and smaller than 1, and $e<f$ holds.

In an example in FIG. 12, when the coding rate is less than f in a case of one encoded block z (z is a natural number), "method #B" is used.

Then, when the coding rate is e or more and f or less in a case of one encoded block z (z is a natural number), "method #A" is used.

Then, when the coding rate is larger than f in a case of one encoded block z (z is a natural number), "method #B" is used.

There are a and b satisfying a coding rate of e or more and f or less, and the transmission device can select "method #A in a case of coding rate a" and "method #A in a case of coding rate b." (Here, any of coding rate a and coding rate b is a coding rate obtained after puncturing (after bits not to be transmitted are deleted).) (Here, a≠b holds.)

In this case, there are a and b satisfying one of following conditions.

Condition 12-1: An LDPC code that is a base of "method #A in a case of coding rate a" and an LDPC code that is a base of "method #A in a case of coding rate b" are different codes.

Condition 12-2: A parity check matrix of an LDPC code that is a base of "method #A in a case of coding rate a" and a parity check matrix of an LDPC code that is a base of "method #A in a case of coding rate b" are different.

Condition 12-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 12-4: A number of columns of a parity check matrix of an LDPC code that is a base of "method #A in a case of coding rate a" and a number of columns of a parity check matrix of an LDPC code that is a base of "method #A in a case of coding rate b" are different.

Note that "number of bits z of one encoded block is set to a certain value" as described above.

Hence, there may be one or more types of coding rates which are less than f, there may be two or more types of coding rates which are e or more and f or less and there may be one or more types of coding rates which are larger than f.

A number of bits of one encoded block is z bits. Note that z is a natural number.

The z bits of one encoded block are realized by using an "LDPC coding method using puncturing." Note that this method will be referred to as "method #A."

The z bits of one encoded block are realized by using an "LDPC coding method which does not perform puncturing." Note that this method will be referred to as "method #B."

The transmission device and the reception device select a coding rate from coding rates illustrated in FIG. 13. Note that the number of bits of one encoded block can also be set.

FIG. 13 is an example illustrating which one of "method #A" and "method #B" is used for number of bits z of one encoded block. Note that in a case of "method #A," a coding rate means a coding rate obtained after puncturing (after bits not to be transmitted are deleted) instead of a coding rate of the LDPC code.

In FIG. 13, g is larger than 0 and is smaller than 1.

In an example in FIG. 13, when the coding rate is less than g in a case of one encoded block z (z is a natural number), "method #B" is used.

Then, when the coding rate is g or more in a case of one encoded block z (z is a natural number), "method #A" is used.

There are a and b satisfying a coding rate of g or more, the transmission device can select "method #A in a case of coding rate a" and "method #A in a case of coding rate b." (Here, any of coding rate a and coding rate b is a coding rate obtained after puncturing (after bits not to be transmitted are deleted).) (Here, a≠b holds.) In this case, there are a and b satisfying one of following conditions.

Condition 13-1: An LDPC code that is a base of "method #A in a case of coding rate a" and an LDPC code that is a base of "method #A in a case of coding rate b" are different codes.

Condition 13-2: A parity check matrix of an LDPC code that is a base of "method #A in a case of coding rate a" and a parity check matrix of an LDPC code that is a base of "method #A in a case of coding rate b" are different.

Condition 13-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 13-4: A number of columns of a parity check matrix of an LDPC code that is a base of "method #A in a case of coding rate a" and a number of columns of a parity check matrix of an LDPC code that is a base of "method #A in a case of coding rate b" are different.

Note that "number of bits z of one encoded block is set to a certain value" as described above.

Hence, there may be one or more types of coding rates which are less than g, and two or more types of coding rates which are g or more.

A number of bits of one encoded block is z bits. Note that z is a natural number.

The z bits of one encoded block are realized by using an "LDPC coding method using puncturing." Note that this method will be referred to as "method #A."

The z bits of one encoded block are realized by using an "LDPC coding method which does not perform puncturing." Note that this method will be referred to as "method #B."

The transmission device and the reception device select a coding rate from coding rates illustrated in FIG. 14. Note that the number of bits of one encoded block can also be set.

FIG. 14 is an example illustrating which one of "method #A" and "method #B" is used for number of bits z of one encoded block. Note that in a case of "method #A," a coding rate means a coding rate obtained after puncturing (after bits not to be transmitted are deleted) instead of a coding rate of the LDPC code.

In FIG. 14, h is larger than 0 and is smaller than 1.

In an example in FIG. 14, when the coding rate is less than h in a case of one encoded block z (z is a natural number), "method #A" is used.

Then, when the coding rate is h or more in a case of one encoded block z (z is a natural number), "method #B" is used.

There are a and b satisfying a coding rate of less than h, and the transmission device can select "method #A in a case of coding rate a" and "method #A in a case of coding rate b." (Here, any of coding rate a and coding rate b is a coding rate obtained after puncturing (after bits not to be transmitted are deleted).) (Here, a≠b holds.) In this case, there are a and b satisfying one of following conditions.

Condition 14-1: An LDPC code that is a base of "method #A in a case of coding rate a" and an LDPC code that is a base of "method #A in a case of coding rate b" are different codes.

Condition 14-2: A parity check matrix of an LDPC code that is a base of "method #A in a case of coding rate a" and a parity check matrix of an LDPC code that is a base of "method #A in a case of coding rate b" are different.

Condition 14-3: A number of rows of a parity check matrix of an LDPC code that is a base of "method #A in a case of coding rate a" and a number of rows of a parity check matrix of an LDPC code that is a base of "method #A in a case of coding rate b" are different.

Condition 14-4: A number of columns of a parity check matrix of an LDPC code that is a base of "method #A in a case of coding rate a" and a number of columns of a parity check matrix of an LDPC code that is a base of "method #A in a case of coding rate b" are different.

Note that "number of bits z of one encoded block is set to a certain value" as described above.

Hence, there may be two or more types of coding rates which are less than h, and one or more types of coding rates which are h or more.

Operations of the transmission device and the reception device are as described above with reference to FIGS. 1, 11 and the like.

The transmission device sets to a predetermined value a value of one encoded block of data to be transmitted, and provides a threshold. The transmission device selects the "LDPC coding method which does not perform puncturing" when the coding rate is the threshold or more, and selects the "LDPC coding method using puncturing" when the coding rate is less than the threshold. Alternatively, the transmission device selects the "LDPC coding method using puncturing" when the coding rate is the threshold or more, and selects the "LDPC coding method which does not perform puncturing" when the coding rate is less than the threshold. Consequently, the reception device can obtain an effect of obtaining higher data reception quality at any coding rate.

(Exemplary Embodiment A)

In the present exemplary embodiment, examples of configurations of a control information transmission method and transmission device and configurations of a control information reception method and reception device according to above-described exemplary embodiment will be described.

FIG. 15 illustrates an example of parameters of an error correction code according to the present exemplary embodiment. A number of bits of one encoded block is z bits. Note that z is a natural number.

The z bits of one encoded block are realized by using an "LDPC coding method using puncturing." This method will be referred to as "method #A."

The z bits of one encoded block are realized by using an "LDPC coding method which does not perform puncturing." This method will be referred to as "method #B."

The z bits of one encoded block will be described supplementally.

In a case of the "LDPC coding method using puncturing," coding is performed on an LDPC code (LDPC block code) with a code length (block length) of z+γ bits (γ is a natural number), and data of the z+γ bits is obtained. Then, the γ bits are punctured (the γ bits not to be transmitted are determined), and data of the z bits to be transmitted is obtained. In a case of the "LDPC coding method using puncturing," the "z bits of one encoded block" means that "this data to be transmitted is of the z bits."

In a case of the "LDPC coding method which does not perform puncturing," coding is performed on an LDPC code (LDPC block code) with a code length of z bits, and data of the z bits is obtained and transmitted. The "z bits of one encoded block" means that "this data to be transmitted is of the z bits."

FIG. 15 is an example illustrating which one of "method #A" and "method #B" is used for number of bits z and a coding rate of one encoded block. Note that in a case of "method #A," a coding rate means a coding rate obtained after puncturing (after bits not to be transmitted are deleted) instead of a coding rate of the LDPC code (instead of a coding rate obtained before puncturing).

In the example in FIG. 15, in a case of one encoded block z=16200 bits, "method #A" realizes coding rates 5/15, 6/15, 7/15 and 8/15, and "method #B" realizes coding rates 9/15, 10/15, 11/15, 12/15 and 13/15.

Then, in a case of one encoded block z=64800 bits, "method #B" realizes coding rates 5/15, 6/15, 7/15, 8/15, 9/15, 10/15, 11/15, 12/15 and 13/15.

Features in FIG. 15 are such that the "transmission device and the reception device support number of bits x (x is a natural number) of one encoded block and number of bits y (y is a natural number) of one encoded block. When x>y holds, "method #B" is used at all coding rates in a case of number of bits x (x is a natural number) of one encoded block, and there are coding rates which adopt "method #A" in a case of number of bits y of one encoded block." Therefore, in FIG. 15, in a case of z=16200 bits, "method #A" is used at coding rates 5/15, 6/15, 7/15 and 8/15 (however, FIG. 15 is only an example, and, in a case of z=16200 bits, there only needs to be coding rates which adopt "method #A").

Moreover, as described above, FIG. 15 may be interpreted such that "number of bits x (x is a natural number) of one encoded block and number of bits y (y is a natural number) of one encoded block are supported at a certain coding rate. When x>y holds, "method #B" is used in a case of number of bits x of one encoded block, and "method #A" is used in a case of number of bits y of one encoded block" (however, at another coding rate, "method #B" may be used for both of number of bits x of one encoded block and number of bits y of one encoded block).

FIG. 16 is an example different from FIG. 15 and illustrating which one of "method #A" and "method #B" is used for number of bits z and a coding rate of one encoded block. Note that in a case of "method #A," a coding rate means a coding rate obtained after puncturing (after bits not to be transmitted are deleted) instead of a coding rate of the LDPC code (instead of a coding rate obtained before puncturing).

In the example in FIG. 16, when one encoded block z is 10000 bits or more and 20000 bits or less, "method #A" realizes coding rates 5/15, 6/15 and 7/15, and "method #B" realizes coding rates 8/15, 9/15, 10/15, 11/15, 12/15 and 13/15.

Then, when number of bits z of one encoded block is 50000 bits or more and 70000 bits or less, "method #B" realizes coding rates 5/15, 6/15, 7/15, 8/15, 9/15, 10/15, 11/15, 12/15 and 13/15.

As described above, features of FIG. 16 are such that "number of bits x (x is a natural number) of one encoded block and number of bits y (y is a natural number) of one encoded block are supported at a certain coding rate. When x>y holds, "method #B" is used in a case of number of bits x of one encoded block, and "method #A" is used in a case of number of bits y of one encoded block" (however, at another coding rate, "method #B" may be used for both of number of bits x of one encoded block and number of bits y of one encoded block).

Figure 17:
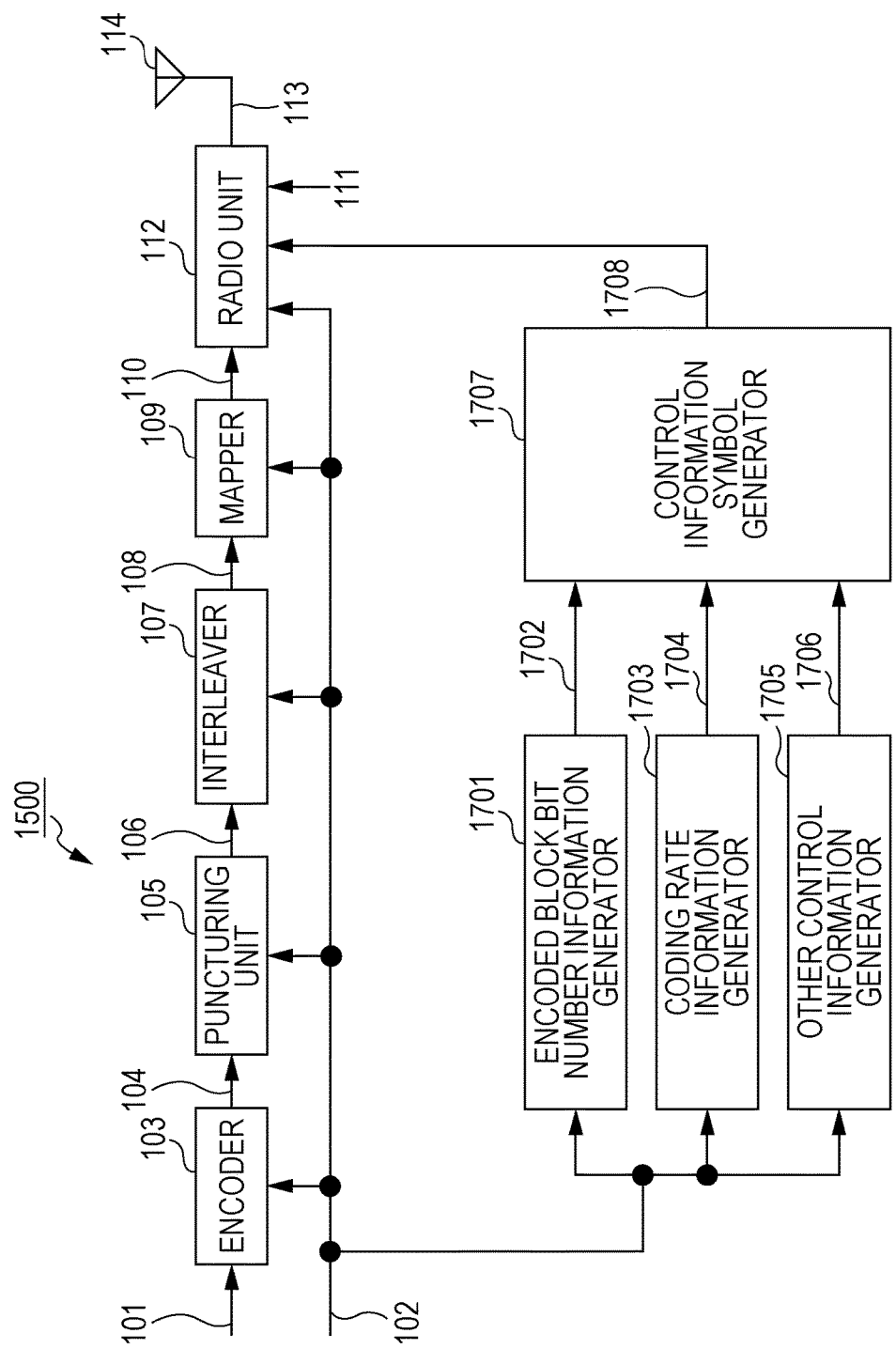
FIG. 17 is a view illustrating an example of a configuration of a transmission device.

FIG. 17 illustrates an example of a configuration of the transmission device, and the same operations as those in FIG. 1 will be assigned the same reference numerals and will not be described. Encoder 103 in FIG. 17 receives an input of information 101 and control information 102, and performs error correction processing based on FIG. 15 or 16.

For example, a case where the error correction coding is performed based on FIG. 15 will be described.

Control information 102 includes information of number of bits z of one encoded block of an error correction code (LDPC code), and information of a coding rate used for error correction coding (a coding rate obtained after puncturing when puncturing is performed).

Here, in a case of "method #A," a coding rate used for error correction coding means a coding rate obtained after puncturing (after bits not to be transmitted are deleted) instead of a coding rate of the LDPC code (instead of a coding rate obtained before puncturing). Then, in a case of "method #B," the coding rate used for error correction coding means a coding rate of an LDPC code.

Therefore, for example, based on FIG. 15, encoder 103 receives an input of information 101 and control information 102. Encoder 103 performs error correction coding (including puncturing processing) on information 101 based on the information of number of bits z of one encoded block of the error correction code (LDPC code) included in control information 102, and the information of the coding rate used for the error correction coding included in control information 102. Encoder 103 outputs data 104 obtained after the error correction coding.

In a case where the information of number of bits z of one encoded block of the error correction code (LDPC code) included in control information 102 indicates z=16200 bits, and where the information of the coding rate used for error correction coding indicates a coding rate 5/15, encoder 103 performs encoding in "method #A" corresponding to the coding rate 5/15 (as described above, encoder 103 performs encoding of an LDPC code, and performs puncturing (encoder 103 selects bits not to be transmitted and determines data to be transmitted)).

In a case where the information of number of bits z of one encoded block of the error correction code (LDPC code) included in control information 102 indicates z=16200 bits, and where the information of the coding rate used for error correction coding indicates a coding rate 6/15, encoder 103 performs encoding in "method #A" corresponding to the coding rate 6/15 (as described above, encoder 103 performs encoding of an LDPC code, and performs puncturing (encoder 103 selects bits not to be transmitted and determines data to be transmitted)).

In a case where the information of number of bits z of one encoded block of the error correction code (LDPC code) included in control information 102 indicates z=16200 bits, and where the information of the coding rate used for error correction coding indicates a coding rate 7/15, encoder 103 performs encoding in "method #A" corresponding to the coding rate 7/15 (as described above, encoder 103 performs encoding of an LDPC code, and performs puncturing (encoder 103 selects bits not to be transmitted and determines data to be transmitted)).

In a case where the information of number of bits z of one encoded block of the error correction code (LDPC code) included in control information 102 indicates z=16200 bits, and where the information of the coding rate used for error correction coding indicates a coding rate 8/15, encoder 103 performs encoding in "method #A" corresponding to the coding rate 8/15 (as described above, encoder 103 performs encoding of an LDPC code, and performs puncturing (encoder 103 selects bits not to be transmitted and determines data to be transmitted)).

In a case where the information of number of bits z of one encoded block of the error correction code (LDPC code) included in control information 102 indicates z=16200 bits, and where the information of the coding rate used for error correction coding indicates a coding rate 9/15, encoder 103 performs encoding in "method #B" corresponding to the coding rate 9/15 (encoder 103 does not perform puncturing as described above).

In a case where the information of number of bits z of one encoded block of the error correction code (LDPC code) included in control information 102 indicates z=16200 bits, and where the information of the coding rate used for error correction coding indicates a coding rate 10/15, encoder 103 performs encoding in "method #B" corresponding to the coding rate 10/15 (encoder 103 does not perform puncturing as described above).

In a case where the information of number of bits z of one encoded block of the error correction code (LDPC code) included in control information 102 indicates z=16200 bits, and where the information of the coding rate used for error correction coding indicates a coding rate 11/15, encoder 103 performs encoding in "method #B" corresponding to the coding rate 11/15 (encoder 103 does not perform puncturing as described above).

In a case where the information of number of bits z of one encoded block of the error correction code (LDPC code) included in control information 102 indicates z=16200 bits, and where the information of the coding rate used for error correction coding indicates a coding rate 12/15, encoder 103 performs encoding in "method #B" corresponding to the coding rate 12/15 (encoder 103 does not perform puncturing as described above).

In a case where the information of number of bits z of one encoded block of the error correction code (LDPC code) included in control information 102 indicates z=16200 bits, and where the information of the coding rate used for error correction coding indicates a coding rate 13/15, encoder 103 performs encoding in "method #B" corresponding to the coding rate 13/15 (encoder 103 does not perform puncturing as described above).

In a case where the information of number of bits z of one encoded block of the error correction code (LDPC code) included in control information 102 indicates z=64800 bits, and where the information of the coding rate used for error correction coding indicates a coding rate 5/15, encoder 103 performs encoding in "method #B" corresponding to the coding rate 5/15 (encoder 103 does not perform puncturing as described above).

In a case where the information of number of bits z of one encoded block of the error correction code (LDPC code) included in control information 102 indicates z=64800 bits, and where the information of the coding rate used for error correction coding indicates a coding rate 6/15, encoder 103 performs encoding in "method #B" corresponding to the coding rate 6/15 (encoder 103 does not perform puncturing as described above).

In a case where the information of number of bits z of one encoded block of the error correction code (LDPC code) included in control information 102 indicates z=64800 bits, and where the information of the coding rate used for error correction coding indicates a coding rate 7/15, encoder 103 performs encoding in "method #B" corresponding to the coding rate 7/15 (encoder 103 does not perform puncturing as described above).

In a case where the information of number of bits z of one encoded block of the error correction code (LDPC code) included in control information 102 indicates z=64800 bits, and where the information of the coding rate used for error correction coding indicates a coding rate 8/15, encoder 103 performs encoding in "method #B" corresponding to the coding rate 8/15 (encoder 103 does not perform puncturing as described above).

In a case where the information of number of bits z of one encoded block of the error correction code (LDPC code) included in control information 102 indicates z=64800 bits, and where the information of the coding rate used for error correction coding indicates a coding rate 9/15, encoder 103 performs encoding in "method #B" corresponding to the coding rate 9/15 (encoder 103 does not perform puncturing as described above).

In a case where the information of number of bits z of one encoded block of the error correction code (LDPC code) included in control information 102 indicates z=64800 bits, and where the information of the coding rate used for error correction coding indicates a coding rate 10/15, encoder 103 performs encoding in "method #B" corresponding to the coding rate 10/15 (encoder 103 does not perform puncturing as described above).

In a case where the information of number of bits z of one encoded block of the error correction code (LDPC code) included in control information 102 indicates z=64800 bits, and where the information of the coding rate used for error correction coding indicates a coding rate 11/15, encoder 103 performs encoding in "method #B" corresponding to the coding rate 11/15 (encoder 103 does not perform puncturing as described above).

In a case where the information of number of bits z of one encoded block of the error correction code (LDPC code) included in control information 102 indicates z=64800 bits, and where the information of the coding rate used for error correction coding indicates a coding rate 12/15, encoder 103 performs encoding in "method #B" corresponding to the coding rate 12/15 (encoder 103 does not perform puncturing as described above).

In a case where the information of number of bits z of one encoded block of the error correction code (LDPC code) included in control information 102 indicates z=64800 bits, and where the information of the coding rate used for error correction coding indicates a coding rate 13/15, encoder 103 performs encoding in "method #B" corresponding to the coding rate 13/15 (encoder 103 does not perform puncturing as described above).

For example, based on FIG. 16, encoder 103 receives an input of information 101 and control information 102. Encoder 103 performs error correction coding (including puncturing processing) on information 101 based on the information of number of bits z of one encoded block of the error correction code (LDPC code) included in control information 102, and the information of the coding rate used for the error correction coding included in control information 102. Encoder 103 outputs data 104 obtained after the error correction coding.

In a case where the information of number of bits z of one encoded block of the error correction code (LDPC code) included in control information 102 indicates that "z is 10000 bits or more and 20000 bits or less," and where the information of the coding rate used for error correction coding indicates a coding rate 5/15, encoder 103 performs encoding in "method #A" corresponding to the coding rate 5/15 (as described above, encoder 103 performs encoding of an LDPC code, and performs puncturing (encoder 103 selects bits not to be transmitted and determines data to be transmitted)).

In a case where the information of number of bits z of one encoded block of the error correction code (LDPC code) included in control information 102 indicates that "z is 10000 bits or more and 20000 bits or less," and where the information of the coding rate used for error correction coding indicates a coding rate 6/15, encoder 103 performs encoding in "method #A" corresponding to the coding rate 6/15 (as described above, encoder 103 performs encoding of an LDPC code, and performs puncturing (encoder 103 selects bits not to be transmitted and determines data to be transmitted)).

In a case where the information of number of bits z of one encoded block of the error correction code (LDPC code) included in control information 102 indicates that "z is 10000 bits or more and 20000 bits or less," and where the information of the coding rate used for error correction coding indicates a coding rate 7/15, encoder 103 performs encoding in "method #A" corresponding to the coding rate 7/15 (as described above, encoder 103 performs encoding of an LDPC code, and performs puncturing (encoder 103 selects bits not to be transmitted and determines data to be transmitted)).

In a case where the information of number of bits z of one encoded block of the error correction code (LDPC code) included in control information 102 indicates that "z is 10000 bits or more and 20000 bits or less," and where the information of the coding rate used for error correction coding indicates a coding rate 8/15, encoder 103 performs encoding in "method #B" corresponding to the coding rate 8/15 (encoder 103 does not perform puncturing as described above).

In a case where the information of number of bits z of one encoded block of the error correction code (LDPC code) included in control information 102 indicates that "z is 10000 bits or more and 20000 bits or less," and where the information of the coding rate used for error correction coding indicates a coding rate 9/15, encoder 103 performs encoding in "method #B" corresponding to the coding rate 9/15 (encoder 103 does not perform puncturing as described above).

In a case where the information of number of bits z of one encoded block of the error correction code (LDPC code) included in control information 102 indicates that "z is 10000 bits or more and 20000 bits or less," and where the information of the coding rate used for error correction coding indicates a coding rate 10/15, encoder 103 performs encoding in "method #B" corresponding to the coding rate 10/15 (encoder 103 does not perform puncturing as described above).

In a case where the information of number of bits z of one encoded block of the error correction code (LDPC code) included in control information 102 indicates that "z is 10000 bits or more and 20000 bits or less," and where the information of the coding rate used for error correction coding indicates a coding rate 11/15, encoder 103 performs encoding in "method #B" corresponding to the coding rate 11/15 (encoder 103 does not perform puncturing as described above).

In a case where the information of number of bits z of one encoded block of the error correction code (LDPC code) included in control information 102 indicates that "z is 10000 bits or more and 20000 bits or less," and where the information of the coding rate used for error correction coding indicates a coding rate 12/15, encoder 103 performs encoding in "method #B" corresponding to the coding rate 12/15 (encoder 103 does not perform puncturing as described above).

In a case where the information of number of bits z of one encoded block of the error correction code (LDPC code) included in control information 102 indicates that "z is 10000 bits or more and 20000 bits or less," and where the information of the coding rate used for error correction coding indicates a coding rate 13/15, encoder 103 performs encoding in "method #B" corresponding to the coding rate 13/15 (encoder 103 does not perform puncturing as described above).

In a case where the information of number of bits z of one encoded block of the error correction code (LDPC code) included in control information 102 indicates that "z is 50000 bits or more and 70000 bits or less," and where the information of the coding rate used for error correction coding indicates a coding rate 5/15, encoder 103 performs encoding in "method #B" corresponding to the coding rate 5/15 (encoder 103 does not perform puncturing as described above).

In a case where the information of number of bits z of one encoded block of the error correction code (LDPC code) included in control information 102 indicates that "z is 50000 bits or more and 70000 bits or less," and where the information of the coding rate used for error correction coding indicates a coding rate 6/15, encoder 103 performs encoding in "method #B" corresponding to the coding rate 6/15 (encoder 103 does not perform puncturing as described above).

In a case where the information of number of bits z of one encoded block of the error correction code (LDPC code) included in control information 102 indicates that "z is 50000 bits or more and 70000 bits or less," and where the information of the coding rate used for error correction coding indicates a coding rate 7/15, encoder 103 performs encoding in "method #B" corresponding to the coding rate 7/15 (encoder 103 does not perform puncturing as described above).

In a case where the information of number of bits z of one encoded block of the error correction code (LDPC code) included in control information 102 indicates that "z is 50000 bits or more and 70000 bits or less," and where the information of the coding rate used for error correction coding indicates a coding rate 8/15, encoder 103 performs encoding in "method #B" corresponding to the coding rate 8/15 (encoder 103 does not perform puncturing as described above).

In a case where the information of number of bits z of one encoded block of the error correction code (LDPC code) included in control information 102 indicates that "z is 50000 bits or more and 70000 bits or less," and where the information of the coding rate used for error correction coding indicates a coding rate 9/15, encoder 103 performs encoding in "method #B" corresponding to the coding rate 9/15 (encoder 103 does not perform puncturing as described above).

In a case where the information of number of bits z of one encoded block of the error correction code (LDPC code) included in control information 102 indicates that "z is 50000 bits or more and 70000 bits or less," and where the information of the coding rate used for error correction coding indicates a coding rate 10/15, encoder 103 performs encoding in "method #B" corresponding to the coding rate 10/15 (encoder 103 does not perform puncturing as described above).

In a case where the information of number of bits z of one encoded block of the error correction code (LDPC code) included in control information 102 indicates that "z is 50000 bits or more and 70000 bits or less," and where the information of the coding rate used for error correction coding indicates a coding rate 11/15, encoder 103 performs encoding in "method #B" corresponding to the coding rate 11/15 (encoder 103 does not perform puncturing as described above).

In a case where the information of number of bits z of one encoded block of the error correction code (LDPC code) included in control information 102 indicates that "z is 50000 bits or more and 70000 bits or less," and where the information of the coding rate used for error correction coding indicates a coding rate 12/15, encoder 103 performs encoding in "method #B" corresponding to the coding rate 12/15 (encoder 103 does not perform puncturing as described above).

In a case where the information of number of bits z of one encoded block of the error correction code (LDPC code) included in control information 102 indicates that "z is 50000 bits or more and 70000 bits or less," and where the information of the coding rate used for error correction coding indicates a coding rate 13/15, encoder 103 performs encoding in "method #B" corresponding to the coding rate 13/15 (encoder 103 does not perform puncturing as described above).

Encoded block bit number information generator 1701 receives an input of control information 102. Encoded block bit number information generator 1701 extracts information of number of bits z of one encoded block of an error correction code (LDPC code) included in control information 102. Encoded block bit number information generator 1701 outputs information 1702 of the number of bits of one encoded block for forming a control information symbol.

Coding rate information generator 1703 receives an input of control information 102. Coding rate information generator 1703 extracts information of a coding rate used for error correction coding included in control information 102 (a coding rate obtained after puncturing when puncturing is performed). Coding rate information generator 1703 outputs information 1704 of the coding rate used for the error correction coding for forming the control information symbol.

Other control information generator 1705 receives an input of control information 102. Other control information generator 1705 outputs control information 1706 for forming a control information symbol other than information of the number of bits of one encoded block for forming a control information symbol and information of a coding rate used for error correction coding for forming a control information symbol.

Control information symbol generator 1707 receives an input of information 1702 of the number of bits of one encoded block, information 1704 of a coding rate used for error correction coding, and control information 1706. Control information symbol generator 1707 performs processing such as error correction coding and mapping, and outputs control information symbol baseband signal 1708.

Radio unit 112 receives an input of control information 102, baseband signal 110, pilot signal 111 and control information symbol baseband signal 1708. Based on information related to a frame configuration included in control information 102, radio unit 112 generates and outputs transmission signal 113 which is based on a frame configuration (radio unit 112 performs processing such as inverse Fourier transform and frequency conversion in a case of, for example, using OFDM (Orthogonal Frequency Division Multiplexing)).

Figure 18:
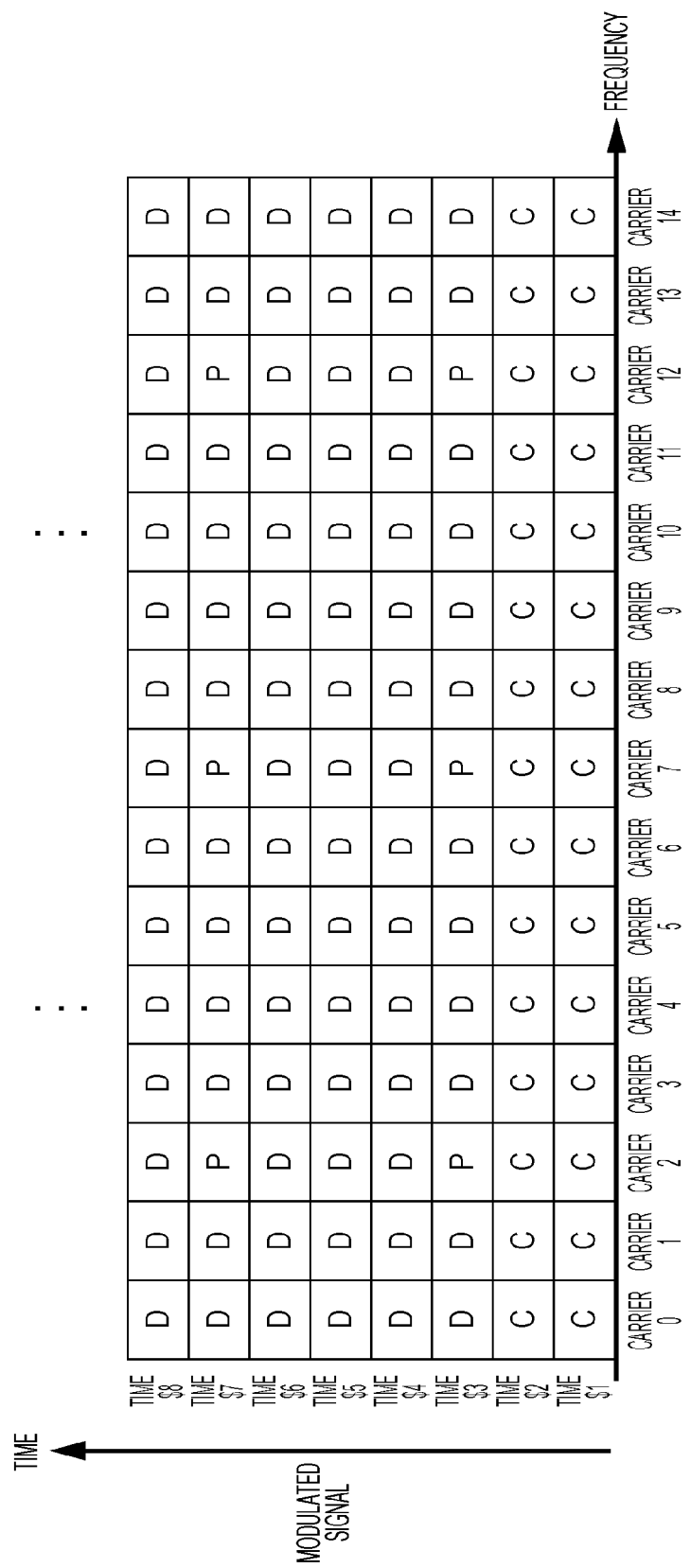
FIG. 18 is a view illustrating an example of a frame configuration of a modulated signal transmitted by the transmission device.

FIG. 18 illustrates an example of a frame configuration of a modulated signal transmitted by the transmission device in FIG. 17 (an example of a frame configuration in a case of transmitting one modulated signal). In FIG. 18, a vertical axis indicates time, and a horizontal axis indicates a frequency. For example, in a case of a multi-carrier method such as OFDM (Orthogonal Frequency Division Multiplexing), there is a plurality of carriers. For this reason, it is assumed here that there are symbols in carrier 0 to carrier 14. Then, in FIG. 18, time $1 to time $8 are indicated.

In FIG. 18, "C" indicates a control information symbol, "P" indicates a pilot symbol and "D" indicates a data symbol. As described above with reference to FIG. 17, the control information symbol includes information of the number of bits of one encoded block and information of a coding rate used for error correction coding.

The pilot symbol is a symbol for channel estimation (propagation channel fluctuation estimation), frequency synchronization, time synchronization, signal detection, frequency offset estimation and the like performed by the reception device which receives a modulated signal transmitted by the transmission device. For example, the pilot symbol only needs to be a symbol modulated by using PSK (Phase Shift Keying) modulation and known in a transmitter and a receiver (or a receiver may be capable of learning a symbol transmitted by the transmitter by establishing synchronization).

The data symbol is a symbol for transmitting data generated based on, for example, FIG. 15 or 16 and obtained after error correction coding (note that the number of bits of one encoded block of data obtained after error correction coding, and the coding rate used for error correction coding are a number of bits of one encoded block and a coding rate used for error correction coding which are specified by information of the number of bits of one encoded block and information of a coding rate used for error correction coding included in a control information symbol).

Next, an operation of the reception device which receives a modulated signal transmitted by the transmission device in FIG. 17 will be described.

A configuration of the reception device which receives a modulated signal transmitted by the transmission device in FIG. 17 is as indicated by 150 in FIG. 1. Operations of control information demodulator 159 and decoder 167 in reception device 150 in FIG. 1 in particular will be described in detail below.

Figure 19:
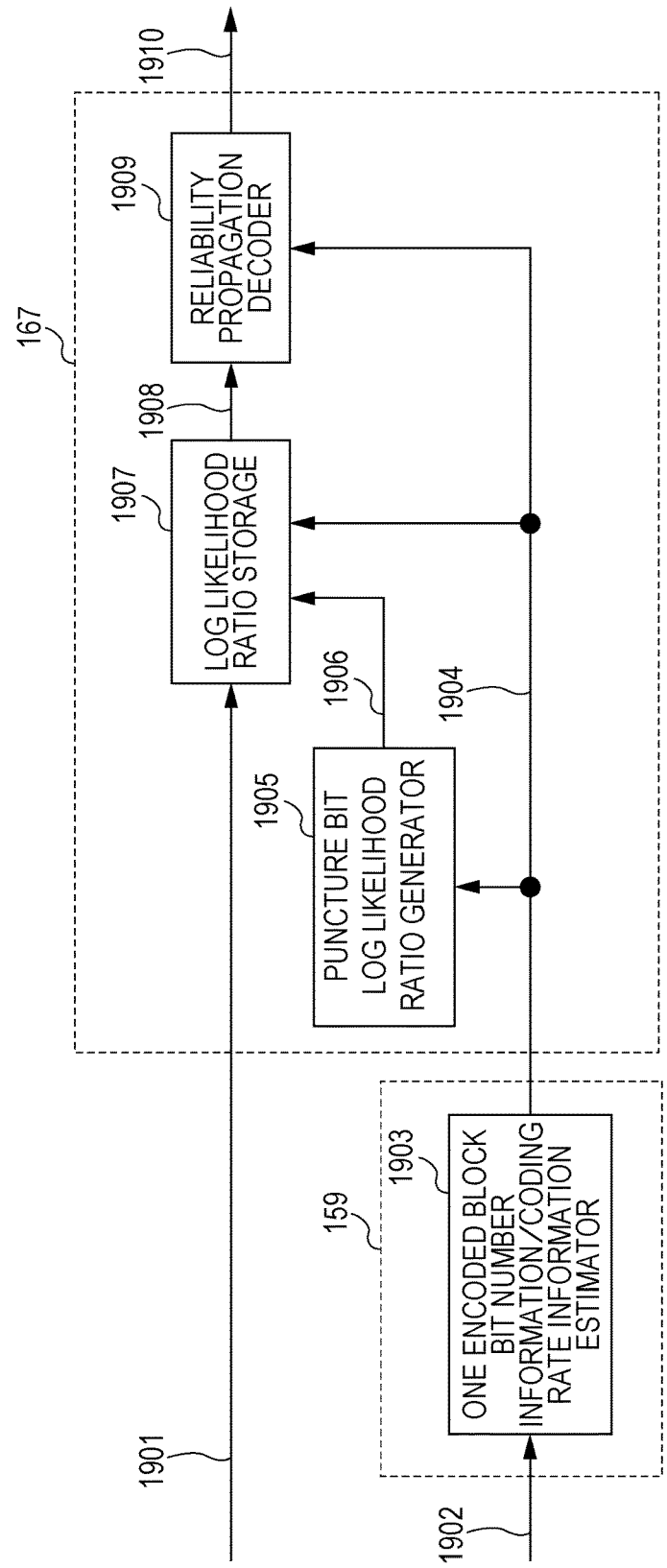
FIG. 19 is a view illustrating an example of a configuration of a portion related to a control information demodulator and a decoder.

FIG. 19 is a view illustrating a configuration of a portion related to control information demodulator 159 and decoder 167 in reception device 150 in FIG. 1.

Control information demodulator 159 includes one encoded block bit number information/coding rate information estimator 1903. One encoded block bit number information/coding rate information estimator 1903 receives an input of baseband signal 1902, and extracts the control information symbol illustrated in FIG. 18. Further, one encoded block bit number information/coding rate information estimator 1903 obtains information of the number of bits of one encoded block and information of a coding rate used for error correction coding, from the control information symbol. One encoded block bit number information/coding rate information estimator 1903 outputs estimation signal 1904 of the information of the number of bits of one encoded block and the information of the coding rate used for error correction coding.

Puncture bit log likelihood ratio generator 1905 receives an input of estimation signal 1904 of the information of the number of bits of one encoded block and the information of the coding rate used for error correction coding. Puncture bit log likelihood ratio generator 1905 determines whether a method used by the transmission device to generate data of a data symbol is "method #A" or "method #B" described with reference to FIGS. 15 and 16, from the information of the number of bits of one encoded block and the information of the coding rate used for error correction coding based on FIG. 15 or 16. When it is determined that the method is "method #B," puncture bit log likelihood ratio generator 1905 generates and outputs log likelihood ratio 106 of bits corresponding to bits (bits which are not transmitted by the transmission device) punctured by the transmission device.

When, for example, the transmission device in FIG. 17 performs encoding based on FIG. 15 and transmits a modulated signal, puncture bit log likelihood ratio generator 1905 determines as follows.

In a case where estimation signal 1904 of the information of the number of bits of one encoded block and the information of the coding rate used for error correction coding indicates that the information of number of bits z of one encoded block of an error correction code (LDPC code) indicates z=16200 bits, and that the information of the coding rate used for error correction coding indicates a coding rate 5/15, puncture bit log likelihood ratio generator 1905 determines that the method used by the transmission device to generate data of a data symbol is "method #A."

In a case where estimation signal 1904 of the information of the number of bits of one encoded block and the information of the coding rate used for error correction coding indicates that the information of number of bits z of one encoded block of an error correction code (LDPC code) indicates z=16200 bits, and that the information of the coding rate used for error correction coding indicates a coding rate 6/15, puncture bit log likelihood ratio generator 1905 determines that the method used by the transmission device to generate data of a data symbol is "method #A."

In a case where estimation signal 1904 of the information of the number of bits of one encoded block and the information of the coding rate used for error correction coding indicates that the information of number of bits z of one encoded block of an error correction code (LDPC code) indicates z=16200 bits, and that the information of the coding rate used for error correction coding indicates a coding rate 7/15, puncture bit log likelihood ratio generator 1905 determines that the method used by the transmission device to generate data of a data symbol is "method #A."

In a case where estimation signal 1904 of the information of the number of bits of one encoded block and the information of the coding rate used for error correction coding indicates that the information of number of bits z of one encoded block of an error correction code (LDPC code) indicates z=16200 bits, and that the information of the coding rate used for error correction coding indicates a coding rate 8/15, puncture bit log likelihood ratio generator 1905 determines that the method used by the transmission device to generate data of a data symbol is "method #A."

In a case where estimation signal 1904 of the information of the number of bits of one encoded block and the information of the coding rate used for error correction coding indicates that the information of number of bits z of one encoded block of an error correction code (LDPC code) indicates z=16200 bits, and that the information of the coding rate used for error correction coding indicates a coding rate 9/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=16200 bits, and that the information of the coding rate used for error correction coding indicates a coding rate 10/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=16200 bits, and that the information of the coding rate used for error correction coding indicates a coding rate 11/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=16200 bits, and that the information of the coding rate used for error correction coding indicates a coding rate 12/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=16200 bits, and that the information of the coding rate used for error correction coding indicates a coding rate 13/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=64800 bits, and that the information of the coding rate used for error correction coding indicates a coding rate 5/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=64800 bits, and that the information of the coding rate used for error correction coding indicates a coding rate 6/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=64800 bits, and that the information of the coding rate used for error correction coding indicates a coding rate 7/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=64800 bits, and that the information of the coding rate used for error correction coding indicates a coding rate 8/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=64800 bits, and that the information of the coding rate used for error correction coding indicates a coding rate 9/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=64800 bits, and that the information of the coding rate used for error correction coding indicates a coding rate 10/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=64800 bits, and that the information of the coding rate used for error correction coding indicates a coding rate 11/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=64800 bits, and that the information of the coding rate used for error correction coding indicates a coding rate 12/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates z=64800 bits, and that the information of the coding rate used for error correction coding indicates a coding rate 13/15, puncture bit log likelihood ratio generator 1905 determines that the method used by the transmission device to generate data of a data symbol is "method #B."

When, for example, the transmission device in FIG. 17 performs encoding based on FIG. 16 and transmits a modulated signal, puncture bit log likelihood ratio generator 1905 determines as follows.

In a case where estimation signal 1904 of the information of the number of bits of one encoded block and the information of the coding rate used for error correction coding indicates that the information of number of bits z of one encoded block of an error correction code (LDPC code) indicates "z being 10000 bits or more and 20000 bits or less," and that the information of the coding rate used for error correction coding indicates a coding rate 5/15, puncture bit log likelihood ratio generator 1905 determines that the method used by the transmission device to generate data of a data symbol is "method #A."

In a case where estimation signal 1904 of the information of the number of bits of one encoded block and the information of the coding rate used for error correction coding indicates that the information of number of bits z of one encoded block of an error correction code (LDPC code) indicates "z being 10000 bits or more and 20000 bits or less," and that the information of the coding rate used for error correction coding indicates a coding rate 6/15, puncture bit log likelihood ratio generator 1905 determines that the method used by the transmission device to generate data of a data symbol is "method #A."

In a case where estimation signal 1904 of the information of the number of bits of one encoded block and the information of the coding rate used for error correction coding indicates that the information of number of bits z of one encoded block of an error correction code (LDPC code) indicates "z being 10000 bits or more and 20000 bits or less," and that the information of the coding rate used for error correction coding indicates a coding rate 7/15, puncture bit log likelihood ratio generator 1905 determines that the method used by the transmission device to generate data of a data symbol is "method #A."

In a case where estimation signal 1904 of the information of the number of bits of one encoded block and the information of the coding rate used for error correction coding indicates that the information of number of bits z of one encoded block of an error correction code (LDPC code) indicates "z being 10000 bits or more and 20000 bits or less," and that the information of the coding rate used for error correction coding indicates a coding rate 8/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 10000 bits or more and 20000 bits or less," and that the information of the coding rate used for error correction coding indicates a coding rate 9/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 10000 bits or more and 20000 bits or less," and that the information of the coding rate used for error correction coding indicates a coding rate 10/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 10000 bits or more and 20000 bits or less," and that the information of the coding rate used for error correction coding indicates a coding rate 11/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 10000 bits or more and 20000 bits or less," and that the information of the coding rate used for error correction coding indicates a coding rate 12/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 10000 bits or more and 20000 bits or less," and that the information of the coding rate used for error correction coding indicates a coding rate 13/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 50000 bits or more and 70000 bits or less," and that the information of the coding rate used for error correction coding indicates a coding rate 5/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 50000 bits or more and 70000 bits or less," and that the information of the coding rate used for error correction coding indicates a coding rate 6/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 50000 bits or more and 70000 bits or less," and that the information of the coding rate used for error correction coding indicates a coding rate 7/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code)

indicates "z being 50000 bits or more and 70000 bits or less," and that the information of the coding rate used for error correction coding indicates a coding rate 8/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 50000 bits or more and 70000 bits or less," and that the information of the coding rate used for error correction coding indicates a coding rate 9/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 50000 bits or more and 70000 bits or less," and that the information of the coding rate used for error correction coding indicates a coding rate 10/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 50000 bits or more and 70000 bits or less," and that the information of the coding rate used for error correction coding indicates a coding rate 11/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 50000 bits or more and 70000 bits or less," and that the information of the coding rate used for error correction coding indicates a coding rate 12/15, puncture bit log likelihood ratio generator 1905 determines that the method used by the transmission device to generate data of a data symbol is "method #B."

In a case where estimation signal 1904 of the information of the number of bits of one encoded block and the information of the coding rate used for error correction coding indicates that the information of number of bits z of one encoded block of an error correction code (LDPC code) indicates "z being 50000 bits or more and 70000 bits or less," and that the information of the coding rate used for error correction coding indicates a coding rate 13/15, puncture bit log likelihood ratio generator 1905 determines that the method used by the transmission device to generate data of a data symbol is "method #B."

(Exemplary Embodiment B)

A modification of exemplary embodiment A will be described.

An example illustrating which one of "method #A" and "method #B" is used for number z of one encoded block and a coding rate is as described with reference to FIGS. 15 and 16 in exemplary embodiment A, and will not be described.

A configuration of a transmission device is as described with reference to FIG. 17 in exemplary embodiment A, and will be described partially.

FIG. 20 is a view illustrating an example of a frame configuration of a modulated signal transmitted by the transmission device in FIG. 17. In FIG. 20, a vertical axis indicates a frequency, and a horizontal axis indicates time. Then, since a transmission method using a multi-carrier such as an OFDM method is used, there is a plurality of carriers on the vertical axis of frequency.

FIG. 20 illustrates first preamble 2001, second preamble 2002, data symbol group #1 2003, data symbol group #2 2004, and data symbol group #3 2005.

The data symbol groups will be described. In a case of a broadcast system, a data symbol group may be allocated per video/audio. For example, a symbol for transmitting a first video/audio stream is data symbol group #1 (2003). A symbol for transmitting a second video/audio stream is data symbol group #2 (2004). A symbol for transmitting a third video/audio stream is data symbol group #3 (note that a PLP (Physical Layer Pipe) may be referred to as a data symbol group. In this case, data symbol group #1 may be referred to as PLP #1, data symbol group #2 may be referred to as a PLP #2, and data symbol group #3 may be referred to as PLP #3).

First preamble 2001 and second preamble 2002 include a symbol for performing frequency synchronization and time synchronization (for example, a PSK (Phase Shift Keying) symbol having signal constellation in an in-phase I-quadrature plane known in a transmitter and a receiver), a symbol for transmitting transmission method information of each data symbol group (information for identifying an SISO (Single-Input Single-Output) method, an MISO (Multiple-Input Single-Output) method and an MIMO method)), a symbol for transmitting information related to an error correction code of each data symbol group (for example, a code length (the number of bits of one encoded block) and a coding rate), a symbol for transmitting information related to a modulation method of each data symbol group (in a case of the MISO method or the MIMO method, since there is a plurality of streams, a plurality of modulation methods is specified), a symbol for transmitting transmission method information of the first and second preambles, a symbol for transmitting information related to a modulation method of the first and second preambles, a symbol for transmitting information related to a method for inserting a pilot symbol, and a symbol for transmitting information related to a method for suppressing PAPR (Peak-to-Average Power Ratio).

Similar to exemplary embodiment A, in the present exemplary embodiment, it is assumed that information of the number of bits of one encoded block of each data symbol group and information of a coding rate used for error correction coding of each data symbol group are included in first preamble (2001) and/or second preamble (2002). Therefore, in a case of the frame configuration in FIG. 20, information of the number of bits of one encoded block of data symbol group #1 and information of a coding rate used for error correction coding of data symbol group #1, information of the number of bits of one encoded block of data symbol group #2 and information of a coding rate used for error correction coding of data symbol group #2, and information of the number of bits of one encoded block of data symbol group #3 and information of a coding rate used for error correction coding of data symbol group #3 are included in first preamble (2001) and/or second preamble (2002).

Therefore, for example, based on FIG. 15, encoder 103 receives an input of information 101 and control information 102. Encoder 103 performs error correction coding (including puncturing processing) on information 101 based on the information of number of bits z of one encoded block of the error correction code (LDPC code) included in control information 102, and the information of the coding rate used for the error correction coding included in control information 102. Encoder 103 outputs data 104 obtained after the error correction coding.

In this case, the following is performed on each data symbol group. Note that in a case of the frame configuration in FIG. 20, the following is carried out assuming that X is 1, 2 and 3.

In a case where information of number of bits z of one encoded block of the error correction code (LDPC code) of data symbol group #X included in control information 102 indicates z=16200 bits, and where information of a coding rate used for error correction coding of data symbol group #X indicates a coding rate 5/15, encoder 103 performs encoding in "method #A" corresponding to the coding rate 5/15 in order to generate data for forming data symbol group #X (as described above, encoder 103 performs encoding of an LDPC code and performs puncturing (encoder 103 selects bits not to be transmitted, and determines data to be transmitted)).

In a case where the information of number of bits z of one encoded block of the error correction code (LDPC code) of data symbol group #X included in control information 102 indicates z=16200 bits, and where the information of a coding rate used for error correction coding of data symbol group #X indicates a coding rate 6/15, encoder 103 performs encoding in "method #A" corresponding to the coding rate 6/15 in order to generate data for forming data symbol group #X (as described above, encoder 103 performs encoding of an LDPC code and performs puncturing (encoder 103 selects bits not to be transmitted, and determines data to be transmitted)).

In a case where the information of number of bits z of one encoded block of the error correction code (LDPC code) of data symbol group #X included in control information 102 indicates z=16200 bits, and where the information of a coding rate used for error correction coding of data symbol group #X indicates a coding rate 7/15, encoder 103 performs encoding in "method #A" corresponding to the coding rate 7/15 in order to generate data for forming data symbol group #X (as described above, encoder 103 performs encoding of an LDPC code and performs puncturing (encoder 103 selects bits not to be transmitted, and determines data to be transmitted)).

In a case where the information of number of bits z of one encoded block of the error correction code (LDPC code) of data symbol group #X included in control information 102 indicates z=16200 bits, and where the information of a coding rate used for error correction coding of data symbol group #X indicates a coding rate 8/15, encoder 103 performs encoding in "method #A" corresponding to the coding rate 8/15 in order to generate data for forming data symbol group #X (as described above, encoder 103 performs encoding of an LDPC code and performs puncturing (encoder 103 selects bits not to be transmitted, and determines data to be transmitted)).

In a case where the information of number of bits z of one encoded block of the error correction code (LDPC code) of data symbol group #X included in control information 102 indicates z=16200 bits, and where the information of a coding rate used for error correction coding of data symbol group #X indicates a coding rate 9/15, encoder 103 performs encoding in "method #B" corresponding to the coding rate 9/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=16200 bits, and where the information of a coding rate used for error correction coding of data symbol group #X indicates a coding rate 10/15, encoder 103 performs encoding in "method #B" corresponding to the coding rate 10/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=16200 bits, and where the information of a coding rate used for error correction coding of data symbol group #X indicates a coding rate 11/15, encoder 103 performs encoding in "method #B" corresponding to the coding rate 11/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=16200 bits, and where the information of a coding rate used for error correction coding of data symbol group #X indicates a coding rate 12/15, encoder 103 performs encoding in "method #B" corresponding to the coding rate 12/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=16200 bits, and where the information of a coding rate used for error correction coding of data symbol group #X indicates a coding rate 13/15, encoder 103 performs encoding in "method #B" corresponding to the coding rate 13/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=64800 bits, and where the information of a coding rate used for error correction coding of data symbol group #X indicates a coding rate 5/15, encoder 103 performs encoding in "method #B" corresponding to the coding rate 5/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=64800 bits, and where the information of a coding rate used for error correction coding of data symbol group #X indicates a coding rate 6/15, encoder 103 performs encoding in "method #B" corresponding to the coding rate 6/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=64800 bits, and where the information of a coding rate used for error correction coding of data symbol group #X indicates a coding rate 7/15, encoder 103 performs encoding in "method #B" corresponding to the coding rate 7/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=64800 bits, and where the information of a coding rate used for error correction coding of data symbol group #X indicates a coding rate 8/15, encoder 103 performs encoding in "method #B" corresponding to the coding rate 8/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=64800 bits, and where the information of a coding rate used for error correction coding of data symbol group #X indicates a coding rate 9/15, encoder 103 performs encoding in "method #B" corresponding to the coding rate 9/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=64800 bits, and where the information of a coding rate used for error correction coding of data symbol group #X indicates a coding rate 10/15, encoder 103 performs encoding in "method #B" corresponding to the coding rate 10/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=64800 bits, and where the information of a coding rate used for error correction coding of data symbol group #X indicates a coding rate 11/15, encoder 103 performs encoding in "method #B" corresponding to the coding rate 11/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=64800 bits, and where the information of a coding rate used for error correction coding of data symbol group #X indicates a coding rate 12/15, encoder 103 performs encoding in "method #B" corresponding to the coding rate 12/15 in order to generate data for forming data symbol group #X (encoder 103 does not perform puncturing as described above).

In a case where the information of number of bits z of one encoded block of the error correction code (LDPC code) of data symbol group #X included in control information 102 indicates z=64800 bits, and where the information of a coding rate used for error correction coding of data symbol group #X indicates a coding rate 13/15, encoder 103 performs encoding in "method #B" corresponding to the coding rate 13/15 in order to generate data for forming data symbol group #X (encoder 103 does not perform puncturing as described above).

For example, based on FIG. 16, encoder 103 receives an input of information 101 and control information 102. Encoder 103 performs error correction coding (including puncturing processing) on information 101 based on the information of number of bits z of one encoded block of the error correction code (LDPC code) included in control information 102, and the information of the coding rate used for the error correction coding included in control information 102. Encoder 103 outputs data 104 obtained after the error correction coding.

In this case, the following is performed on each data symbol group. Note that in a case of the frame configuration in FIG. 20, the following is carried out assuming that X is 1, 2 and 3.

In a case where the information of number of bits z of one encoded block of the error correction code (LDPC code) of data symbol group #X included in control information 102 indicates that "z is 10000 bits or more and 20000 bits or less," and where the information of a coding rate used for error correction coding of data symbol group #X indicates a coding rate 5/15, encoder 103 performs encoding in "method #A" corresponding to the coding rate 5/15 in order to generate data for forming data symbol group #X (as described above, encoder 103 performs encoding of an LDPC code and performs puncturing (encoder 103 selects bits not to be transmitted, and determines data to be transmitted)).

In a case where the information of number of bits z of one encoded block of the error correction code (LDPC code) of data symbol group #X included in control information 102 indicates that "z is 10000 bits or more and 20000 bits or less," and where the information of a coding rate used for error correction coding of data symbol group #X indicates a coding rate 6/15, encoder 103 performs encoding in "method #A" corresponding to the coding rate 6/15 in order to generate data for forming data symbol group #X (as described above, encoder 103 performs encoding of an LDPC code and performs puncturing (encoder 103 selects bits not to be transmitted, and determines data to be transmitted)).

In a case where the information of number of bits z of one encoded block of the error correction code (LDPC code) of data symbol group #X included in control information 102 indicates that "z is 10000 bits or more and 20000 bits or less," and where the information of a coding rate used for error correction coding of data symbol group #X indicates a coding rate 7/15, encoder 103 performs encoding in "method #A" corresponding to the coding rate 7/15 in order to generate data for forming data symbol group #X (as described above, encoder 103 performs encoding of an LDPC code and performs puncturing as described above (encoder 103 selects bits not to be transmitted, and determines data to be transmitted)).

In a case where the information of number of bits z of one encoded block of the error correction code (LDPC code) of data symbol group #X included in control information 102 indicates that "z is 10000 bits or more and 20000 bits or less," and where the information of a coding rate used for error correction coding of data symbol group #X indicates a coding rate 8/15, encoder 103 performs encoding in "method #B" corresponding to the coding rate 8/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 10000 bits or more and 20000 bits or less," and where the information of a coding rate used for error correction coding of data symbol group #X indicates a coding rate 9/15, encoder 103 performs encoding in "method #B" corresponding to the coding rate 9/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 10000 bits or more and 20000 bits or less," and where the information of a coding rate used for error correction coding of data symbol group #X indicates a coding rate 10/15, encoder 103 performs encoding in "method #B" corresponding to the coding rate 10/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 10000 bits or more and 20000 bits or less," and where the information of a coding rate used for error correction coding of data symbol group #X indicates a coding rate 11/15, encoder 103 performs encoding in "method #B" corresponding to the coding rate 11/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 10000 bits or more and 20000 bits or less," and where the information of a coding rate used for error correction coding of data symbol group #X indicates a coding rate 12/15, encoder 103 performs encoding in "method #B" corresponding to the coding rate 12/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 10000 bits or more and 20000 bits or less," and where the information of a coding rate used for error correction coding of data symbol group #X indicates a coding rate 13/15, encoder 103 performs encoding in "method #B" corresponding to the coding rate 13/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 50000 bits or more and 70000 bits or less," and where the information of a coding rate used for error correction coding of data symbol group #X indicates a coding rate 5/15, encoder 103 performs encoding in "method #B" corresponding to the coding rate 5/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 50000 bits or more and 70000 bits or less," and where the information of a coding rate used for error correction coding of data symbol group #X indicates a coding rate 6/15, encoder 103 performs encoding in "method #B" corresponding to the coding rate 6/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 50000 bits or more and 70000 bits or less," and where the information of a coding rate used for error correction coding of data symbol group #X indicates a coding rate 7/15, encoder 103 performs encoding in "method #B" corresponding to the coding rate 7/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 50000 bits or more and 70000 bits or less," and where the information of a coding rate used for error correction coding of data symbol group #X indicates a coding rate 8/15, encoder 103 performs encoding in "method #B" corresponding to the coding rate 8/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 50000 bits or more and 70000 bits or less," and where the information of a coding rate used for error correction coding of data symbol group #X indicates a coding rate 9/15, encoder 103 performs encoding in "method #B" corresponding to the coding rate 9/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 50000 bits or more and 70000 bits or less," and where the information of a coding rate used for error correction coding of data symbol group #X indicates a coding rate 10/15, encoder 103 performs encoding in "method #B" corresponding to the coding rate 10/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 50000 bits or more and 70000 bits or less," and where the information of a coding rate used for error correction coding of data symbol group #X indicates a coding rate 11/15, encoder 103 performs encoding in "method #B" corresponding to the coding rate 11/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 50000 bits or more and 70000 bits or less," and where the information of a coding rate used for error correction coding of data symbol group #X indicates a coding rate 12/15, encoder 103 performs encoding in "method #B" corresponding to the coding rate 12/15 in order to generate data for forming data symbol group #X (encoder 103 does not perform puncturing as described above).

In a case where the information of number of bits z of one encoded block of the error correction code (LDPC code) of data symbol group #X included in control information 102 indicates that "z is 50000 bits or more and 70000 bits or less," and where the information of a coding rate used for error correction coding of data symbol group #X indicates a coding rate 13/15, encoder 103 performs encoding in "method #B" corresponding to the coding rate 13/15 in order to generate data for forming data symbol group #X (encoder 103 does not perform puncturing as described above).

Next, an operation of the reception device which receives a modulated signal transmitted by the transmission device in FIG. 17 will be described.

A configuration of the reception device which receives a modulated signal transmitted by the transmission device in FIG. 17 is as indicated by 150 in FIG. 1. Operations of control information demodulator 159 and decoder 167 in reception device 150 in FIG. 1 in particular will be described in detail below.

FIG. 19 is a view illustrating a configuration of a portion related to control information demodulator 159 and decoder 167 in reception device 150 in FIG. 1.

Control information demodulator 159 includes one encoded block bit number information/coding rate information estimator 1903. One encoded block bit number information/coding rate information estimator 1903 receives an input of baseband signal 1902, and extracts the first preamble and (or) the second preamble illustrated in FIG. 20. Further, one encoded block bit number information/coding rate information estimator 1903 obtains information of the number of bits of one encoded block and information of a coding rate used for error correction coding from the first preamble and (or) the second preamble. One encoded block bit number information/coding rate information estimator 1903 outputs estimation signal 1904 of the information of the number of bits of one encoded block and the information of the coding rate used for error correction coding.

In a case of the present exemplary embodiment, the transmission device in FIG. 17 transmits a modulated signal of the frame configuration based on FIG. 20, and reception device 150 in FIG. 1 receives this modulated signal. In this case, reception device 150 in FIG. 1 performs a demodulating and decoding operation for obtaining data of a necessary data symbol group among a plurality of data symbol groups. Therefore, control information demodulator 159 obtains "information of the number of bits of one encoded block and information of a coding rate used for error correction coding" of the necessary data symbol group. Control information demodulator 159 outputs estimation signal 1904 of information of the number of bits of one encoded block and the information of the coding rate used for error correction coding.

Puncture bit log likelihood ratio generator 1905 receives an input of estimation signal 1904 of the information of the number of bits of one encoded block and the information of the coding rate used for error correction coding. Puncture bit log likelihood ratio generator 1905 determines whether a method used by the transmission device to generate data of a data symbol is "method #A" or "method #B" described with reference to FIGS. 15 and 16, from the information of the number of bits of one encoded block and the information of the coding rate used for error correction coding based on FIG. 15 or 16. When it is determined that the method is "method #B," puncture bit log likelihood ratio generator 1905 generates and outputs log likelihood ratio 106 of bits corresponding to bits (bits which are not transmitted by the transmission device) punctured in the transmission device. Note that that "when it is determined that the method is "method #B," puncture bit log likelihood ratio generator 1905 generates and outputs log likelihood ratio 106 of bits corresponding to bits (bits which are not transmitted by the transmission device) punctured in the transmission device" as described above, but puncture bit log likelihood ratio generator 1905 generates and outputs log likelihood ratio 106 of bits corresponding to bits (bits which are not transmitted by the transmission device) punctured for a necessary data symbol group.

For example, in a case where the transmission device in FIG. 17 performs encoding based on FIG. 15, and transmits a modulated signal of the frame configuration based on FIG. 20, puncture bit log likelihood ratio generator 1905 determined as follows for each data symbol group (X is 1, 2 and 3).

In a case where estimation signal 1904 of the information of the number of bits of one encoded block and the information of the coding rate used for error correction coding indicates that the information of number of bits z of one encoded block of an error correction code (LDPC code) of data symbol group #X indicates z=16200 bits, and that the information of the coding rate used for error correction coding of data symbol group #X indicates a coding rate 5/15, puncture bit log likelihood ratio generator 1905 determines that the method used by the transmission device to generate data of data symbol group #X is "method #A."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=16200 bits, and that the information of the coding rate used for error correction coding of data symbol group #X indicates a coding rate 6/15, puncture bit log likelihood ratio generator 1905 determines that the method used by the transmission device to generate data of data symbol group #X is "method #A."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=16200 bits, and that the information of the coding rate used for error correction coding of data symbol group #X indicates a coding rate 7/15, puncture bit log likelihood ratio generator 1905 determines that the method used by the transmission device to generate data of data symbol group #X is "method #A."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=16200 bits, and that the information of the coding rate used for error correction coding of data symbol group #X indicates a coding rate 8/15, puncture bit log likelihood ratio generator 1905 determines that the method used by the transmission device to generate data of data symbol group #X is "method #A."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=16200 bits, and that the information of the coding rate used for error correction coding of data symbol group #X indicates a coding rate 9/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=16200 bits, and that the information of the coding rate used for error correction coding of data symbol group #X indicates a coding rate 10/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=16200 bits, and that the information of the coding rate used for error correction coding of data symbol group #X indicates a coding rate 11/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=16200 bits, and that the information of the coding rate used for error correction coding of data symbol group #X indicates a coding rate 12/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=16200 bits, and that the information of the coding rate used for error correction coding of data symbol group #X indicates a coding rate 13/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=64800 bits, and that the information of the coding rate used for error correction coding of data symbol group #X indicates a coding rate 5/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=64800 bits, and that the information of the coding rate used for error correction coding of data symbol group #X indicates a coding rate 6/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=64800 bits, and that the information of the coding rate used for error correction coding of data symbol group #X indicates a coding rate 7/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=64800 bits, and that the information of the coding rate used for error correction coding of data symbol group #X indicates a coding rate 8/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=64800 bits, and that the information of the coding rate used for error correction coding of data symbol group #X indicates a coding rate 9/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=64800 bits, and that the information of the coding rate used for error correction coding of data symbol group #X indicates a coding rate 10/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=64800 bits, and that the information of the coding rate used for error correction coding of data symbol group #X indicates a coding rate 11/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=64800 bits, and that the information of the coding rate used for error correction coding of data symbol group #X indicates a coding rate 12/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates z=64800 bits, and that the information of the coding rate used for error correction coding of data symbol group #X indicates a coding rate 13/15, puncture bit log likelihood ratio generator 1905 determines that the method used by the transmission device to generate data of data symbol group #X is "method #B."

For example, in a case where the transmission device in FIG. 17 performs encoding based on FIG. 16, and transmits a modulated signal of the frame configuration based on FIG. 20, puncture bit log likelihood ratio generator 1905 determines as follows for each data symbol group (X is 1, 2 and 3).

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 10000 bits or more and 20000 bits or less," and that the information of the coding rate used for error correction coding of data symbol group #X indicates a coding rate 5/15, puncture bit log likelihood ratio generator 1905 determines that the method used by the transmission device to generate data of data symbol group #X is "method #A."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 10000 bits or more and 20000 bits or less," and that the information of the coding rate used for error correction coding of data symbol group #X indicates a coding rate 6/15, puncture bit log likelihood ratio generator 1905 determines that the method used by the transmission device to generate data of data symbol group #X is "method #A."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 10000 bits or more and 20000 bits or less," and that the information of the coding rate used for error correction coding of data symbol group #X indicates a coding rate 7/15, puncture bit log likelihood ratio generator 1905 determines that the method used by the transmission device to generate data of data symbol group #X is "method #A."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 10000 bits or more and 20000 bits or less," and that the information of the coding rate used for error correction coding of data symbol group #X indicates a coding rate 8/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 10000 bits or more and 20000 bits or less," and that the information of the coding rate used for error correction coding of data symbol group #X indicates a coding rate 9/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 10000 bits or more and 20000 bits or less," and that the information of the coding rate used for error correction coding of data symbol group #X indicates a coding rate 10/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 10000 bits or more and 20000 bits or less," and that the information of the coding rate used for error correction coding of data symbol group #X indicates a coding rate 11/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 10000 bits or more and 20000 bits or less," and that the information of the coding rate used for error correction coding of data symbol group #X indicates a coding rate 12/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 10000 bits or more and 20000 bits or less," and that the information of the coding rate used for error correction coding of data symbol group #X indicates a coding rate 13/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 50000 bits or more and 70000 bits or less," and that the information of the coding rate used for error correction coding of data symbol group #X indicates a coding rate 5/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 50000 bits or more and 70000 bits or less," and that the information of the coding rate used for error correction coding of data symbol group #X indicates a coding rate 6/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 50000 bits or more and 70000 bits or less," and that the information of the coding rate used for error correction coding of data symbol group #X indicates a coding rate 7/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 50000 bits or more and 70000 bits or less," and that the information of the coding rate used for error correction coding of data symbol group #X indicates a coding rate 8/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 50000 bits or more and 70000 bits or less," and that the information of the coding rate used for error correction coding of data symbol group #X indicates a coding rate 9/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 50000 bits or more and 70000 bits or less," and that the information of the coding rate used for error correction coding of data symbol group #X indicates a coding rate 10/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 50000 bits or more and 70000 bits or less," and that the information of the coding rate used for error correction coding of data symbol group #X indicates a coding rate 11/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 50000 bits or more and 70000 bits or less," and that the information of the coding rate used for error correction coding of data symbol group #X indicates a coding rate 12/15, puncture bit log likelihood ratio generator 1905 determines that the method used by the transmission device to generate data of data symbol group #X is "method #B."

In a case where estimation signal 1904 of the information of the number of bits of one encoded block and the information of the coding rate used for error correction coding indicates that the information of number of bits z of one encoded block of an error correction code (LDPC code) of data symbol group #X indicates "z being 50000 bits or more and 70000 bits or less," and that the information of the coding rate used for error correction coding of data symbol group #X indicates a coding rate 13/15, puncture bit log likelihood ratio generator 1905 determines that the method used by the transmission device to generate data of data symbol group #X is "method #B."

The examples Illustrating which one of "method #A" and "method #B" is used for number of bits z of one encoded block and the coding rate are described in exemplary embodiment A and exemplary embodiment B with reference to FIGS. 15 and 16. However, allocation of "method #A" and "method #B" for number of bits z of one encoded block and the coding rate is not limited to those in FIGS. 15 and 16. The features of FIGS. 15 and 16 described in exemplary embodiment A only need to be satisfied. For example, in FIG. 15, z=16800 bits and a coding rate 8/15 may be used for "method #B," and z=16800 bits and a coding rate 9/15 may be used for "method #A."

Moreover, in exemplary embodiment B, the frame configuration of a modulated signal transmitted by the transmission device is described with reference to FIG. 20. However, the frame configuration is not limited to this, and may be, for example, a frame configuration including one or more data symbol groups or two or more data symbol groups.

The broadcast (or communication) system according to the present disclosure is described in the above-described exemplary embodiments. However, the present disclosure is not limited to this.

As a matter of course, a plurality of the exemplary embodiments and other contents described herein may be combined and carried out.

Moreover, each exemplary embodiment and the other contents are only examples. For example, while a "modulation method, an error correction coding method (an error correction code, a code length, a coding rate and the like to be used), control information and the like" are exemplified, each exemplary embodiment and the other contents can be carried out with the same configuration even when other types of a "modulation method, an error correction coding method (an error correction code, a code length, a coding rate and the like to be used), control information and the like" are applied.

As for a modulation method, even when a modulation method other than the modulation methods described herein is used, the exemplary embodiments and other contents described herein can be carried out. For example, APSK (Amplitude Phase Shift Keying) (such as 16 APSK, 64 APSK, 128 APSK, 256 APSK, 1024 APSK and 4096 APSK), PAM (Pulse Amplitude Modulation) (such as 4 PAM, 8 PAM, 16 PAM, 64 PAM, 128 PAM, 256 PAM, 1024 PAM and 4096 PAM), PSK (Phase Shift Keying) (such as BPSK, QPSK, 8 PSK, 16 PSK, 64 PSK, 128 PSK, 256 PSK, 1024 PSK and 4096 PSK), and QAM (Quadrature Amplitude Modulation) (such as 4 QAM, 8 QAM, 16 QAM, 64 QAM, 128 QAM, 256 QAM, 1024 QAM and 4096 QAM) may be applied. In each modulation method, uniform mapping or non-uniform mapping may be performed (any mapping may be performed).

Moreover, a method for arranging 16 signal points, 64 signal points or the like in an I-Q plane (a modulation method having 16 signal points, 64 signal points or the like) is not limited to the signal constellation method of the modulation methods described herein. Therefore, a function of outputting an in-phase component and a quadrature component based on a plurality of bits is a function in a mapper.

The disclosure described herein is applicable to multi-carrier transmission methods such as the OFDM method, and is also applicable to single carrier transmission methods (For example, in a case of a multi-carrier method, symbols are arranged also in a frequency axis, but in a case of a single carrier, symbols are arranged only in a time direction.) Moreover, a spread spectrum communication method is also applicable to baseband signals by using spreading codes.

Herein, a reception device of a terminal and an antenna may be configured separately. For example, the reception device includes an interface which receives through a cable an input of a signal received at the antenna or a signal obtained by performing frequency conversion on a signal received at the antenna, and the reception device performs subsequent processing. Moreover, data and information obtained by the reception device are subsequently converted into a video or a sound to be displayed on a display (monitor) or to be output from a speaker. Further, the data and the information obtained by the reception device may be subjected to signal processing related to a video or a sound (the signal processing may not be performed), and may be output from an RCA terminal (a video terminal or an audio terminal), a USB (Universal Serial Bus), a USB 2, a USB 3, an HDMI (registered trademark) (High-Definition Multimedia Interface), an HDMI (registered trademark) 2, a digital terminal or the like of the reception device. Moreover, the data and the information obtained by the reception device are modulated by using wireless communication methods (Wi-Fi (registered trademark) (IEEE 802.11a, IEEE 802.11b, IEEE 802.11g, IEEE 802.11n, IEEE802.11ac, IEEE 802.11ad and the like), WiGiG, Bluetooth (registered trademark) and the like) or wired communication methods (optical communication and power line communication), and these pieces of information may be transmitted to other apparatuses. In this case, a terminal includes a transmission device which transmits information (in this case, the terminal may transmit data including the data and information obtained by the reception device, or may generate modified data from the data and information obtained by the reception device and transmit the modified data).

Herein, a communication and broadcast apparatus such as a broadcast station, a base station, an access point, a terminal and a mobile phone is considered to include the transmission device. In this case, a communication apparatus such as a television, a radio, a terminal, a personal computer, a mobile phone, an access point and a base station is considered to include the reception device. Moreover, the transmission device and the reception device according to the present disclosure are each also considered to be an apparatus which has a communication function and which can be connected via any interface to a device that executes applications such as a television, a radio, a personal computer and a mobile phone.

Moreover, in the present exemplary embodiment, symbols other than a data symbol, for example, a pilot symbol (a preamble, a unique word, a postamble, a reference symbol and the like), and a control information symbol may be arranged in frames in any way. Then, these symbols are called a pilot symbol or a control information symbol here, but these symbols may be called in any way and the function itself is important.

Hence, for example, a symbol is called a control information symbol, but how to call the symbol is not limited to this, and the symbol may be called in another way. This symbol is a symbol for transmitting control information such as information of a transmission method (for example, a transmission method, a modulation method, a coding rate of an error correction code, a code length of an error correction code, a method for configuring a frame and a Fourier transform method (size)).

Moreover, the pilot symbol only needs to be a symbol modulated by using PSK modulation and known in a transmitter and a receiver (or a receiver may be capable of learning a symbol transmitted by the transmitter by establishing synchronization). The receiver performs frequency synchronization, time synchronization, channel estimation (of each modulated signal) (estimation of CSI (Channel State Information), signal detection and like by using this symbol.

Moreover, the control information symbol is a symbol for transmitting information (for example, a coding rate of a modulation method, an error correction coding method, and the error correction coding method used for communication, and setting information in an upper layer) which needs to be transmitted to a communicating party for realizing communication other than data communication (such as application communication).

Note that the present disclosure is not limited to each exemplary embodiment, and can be variously modified and carried out. For example, the case where each exemplary embodiment is carried out as a communication device is described, but each exemplary embodiment is not limited to this, and can be performed by using this communication method as software.

The transmission antennas of transmitting stations and base stations, the reception antennas of terminals and the one antenna described in the drawings may include a plurality of antennas.

Note that a program for executing the above-described communication method may be stored in a ROM (Read Only Memory) in advance, and a CPU (Central Processing Unit) may be caused to operate this program.

Moreover, the program for executing the above-described communication method may be stored in a computer-readable storage medium, and the program stored in the storage medium may be recorded in a RAM (Random Access Memory) of a computer, and the computer may be caused to operate according to this program.

Then, each configuration of each of the above-described exemplary embodiments and the like may be realized typically as an LSI (Large Scale Integration) which is an integrated circuit. These integrated circuits may be formed separately as one chip, or may be formed as one chip so as to include all or part of the configuration of each exemplary embodiment. Although the LSI is described here, the integrated circuit is also called an IC (Integrated Circuit), a system LSI, a super LSI and an ultra LSI depending on the degree of integration. Moreover, a technique for circuit integration is not limited to the LSI, and may be realized by a dedicated circuit or a general purpose processor. After manufacturing of the LSI, a programmable FPGA (Field Programmable Gate Array) or a reconfigurable processor which is reconfigurable in connection or settings of circuit cells inside the LSI may be used.

Further, as a matter of course, when development of a semiconductor technology or another derived technology provides a technology of circuit integration which replaces the LSI, functional blocks may be integrated by using this technology. Adaptation of biotechnology or the like may be possible.

The present disclosure is widely applicable to a wireless system which transmits different modulated signals from a plurality of antennas. Moreover, the present disclosure is also applicable in a case where MIMO transmission is performed in a wired communication system having a plurality of transmission locations (for example, a PLC (Power Line Communication) system, an optical communication system, and a DSL (Digital Subscriber Line) system).

The transmission method, the reception method, the transmission device and the reception device according to the present disclosure can secure high data reception quality because of high error correction performance.

What is claimed is:

1. A transmission method, executed by a transmitting apparatus, the transmission method comprising:
    selecting one coding scheme from a predetermined coding scheme set, the predetermined coding scheme set including two or more coding schemes having different code lengths for each of a plurality of coding rates;
    encoding an information sequence according to the selected coding scheme to obtain an encoded sequence;
    modulating the encoded sequence to obtain data symbols; and
    transmitting a transmission frame that carries the data symbols,
    wherein
    the predetermined coding scheme set includes at least a first coding scheme and a second coding scheme,
    when the first coding scheme is selected, the coding includes generating a first codeword of a first length as the encoded sequence by using a first bit sequence inputted as the information sequence according to a first parity check matrix, and
    when the second coding scheme is selected, the coding includes generating a second codeword of a second length longer than the first length by using a second bit sequence inputted as the information sequence according to a second parity check matrix different from the first parity check matrix, and discarding a part of the second codeword to generate a third codeword of the first length.

2. A reception method, executed by a reception apparatus, the reception method comprising:
    acquiring information indicating a selected coding scheme which is used for generating an encoded sequence from an information sequence, the encoded sequence being carried in a received signal, the selected coding scheme being selected from a predetermined coding scheme set, the predetermined coding scheme set including two or more coding schemes having different code lengths for each of a plurality of coding rates;
    demodulating a received signal, to obtain demodulated values corresponding to the encoded sequence, based on a phase changing method that is applied to at least one of first modulated symbols and second modulated symbols generated from the encoded sequence; and
    decoding the demodulated values according to a decoding scheme corresponding to the selected coding scheme to obtain a received data, wherein the predetermined coding scheme set includes at least a first coding scheme and second coding scheme,
    when the information indicates that the selected coding scheme is the first coding scheme, the encoded sequence is generated by generating a first codeword of a first length as the encoded sequence by using a first bit sequence inputted as the information sequence according to a first parity check matrix, and
    when the information indicates that the selected coding scheme is the second coding scheme, the encoded sequence is generated by generating a second codeword of a second length longer than the first length by using a second bit sequence inputted as the information sequence according to a second parity check matrix different from the first parity check matrix, and discarding a part of the second codeword to generate a third codeword of the first length.

3. A transmission apparatus, comprising:
    an encoder that, in operation, selects one coding scheme from a predetermined coding scheme set, encodes an information sequence according to the selected coding scheme to obtain an encoded sequence, the predetermined coding scheme set including two or more coding schemes having different code lengths for each of a plurality of coding rates;
    a modulator that, in operation, modulates the encoded sequence to obtain data symbols; and
    a transmitter that transmits a transmission frame that carries the data symbols,
    wherein
    the predetermined coding scheme set includes at least a first coding scheme and a second coding scheme,
    when the first coding scheme is selected, the coding includes generating a first codeword of a first length as the encoded sequence by using a first bit sequence inputted as the information sequence according to a first parity check matrix, and
    when the second coding scheme is selected, the coding includes generating a second codeword of a second length longer than the first length by using a second bit sequence inputted as the information sequence according to a second parity check matrix different from the first parity check matrix, and discarding a part of the second codeword to generate a third codeword of the first length.

4. A reception apparatus comprising:
    an acquisition unit that, in operation, acquires information indicating a selected coding scheme which is used for generating a encoded sequence from a information sequence, the encoded sequence being carried in a received signal, the selected coding scheme being selected from a predetermined coding scheme set, the predetermined coding scheme set including two or more coding schemes having different code lengths for each of a plurality of coding rates;

a demodulator that, in operation, demodulates a received signal, to obtain demodulated values corresponding to the encoded sequence, based on a phase changing method that is applied to at least one of first modulated symbols and second modulated symbols generated from the encoded sequence; and a decoder that, in operation, decodes the demodulated values according to a decoding scheme corresponding to the selected coding scheme to obtain a received data, wherein the predetermined coding scheme set includes at least a first coding scheme and second coding scheme, when the information indicates that the selected coding scheme is the first coding scheme, the encoded sequence is generated by generating a first codeword of a first length as the encoded sequence by using a first bit sequence inputted as the information sequence according to a first parity check matrix, and when the information indicates that the selected coding scheme is the second coding scheme, the encoded sequence is generated by generating a second codeword of a second length longer than the first length by using a second bit sequence inputted as the information sequence according to a second parity check matrix different from the first parity check matrix, and discarding a part of the second codeword to generate a third codeword of the first length.

* * * * *